(12) United States Patent
Miura et al.

(10) Patent No.: US 9,516,747 B2
(45) Date of Patent: Dec. 6, 2016

(54) SUBSTRATE FOR SUSPENSION, AND PRODUCTION PROCESS THEREOF

(71) Applicant: DAI NIPPON PRINTING CO., LTD., Tokyo-to (JP)

(72) Inventors: Yoichi Miura, Tokyo-to (JP); Tsuyoshi Yamazaki, Tokyo-to (JP)

(73) Assignee: DAI NIPPON PRINTING CO., LTD., Tokyo-to (JP)

( * ) Notice: Subject to any disclaimer, the term of this patent is extended or adjusted under 35 U.S.C. 154(b) by 86 days.

(21) Appl. No.: 14/278,490

(22) Filed: May 15, 2014

(65) Prior Publication Data

US 2014/0246224 A1 Sep. 4, 2014

Related U.S. Application Data

(62) Division of application No. 13/171,662, filed on Jun. 29, 2011, now Pat. No. 8,758,910.

(30) Foreign Application Priority Data

Jun. 29, 2010 (JP) .................................. 2010-147526
Jun. 29, 2010 (JP) .................................. 2010-147528

(51) Int. Cl.
*G11B 5/48* (2006.01)
*H05K 1/05* (2006.01)
(Continued)

(52) U.S. Cl.
CPC . *H05K 1/05* (2013.01); *G11B 5/48* (2013.01); *G11B 5/4833* (2013.01); *G11B 5/49* (2013.01);
(Continued)

(58) Field of Classification Search
None
See application file for complete search history.

(56) References Cited

U.S. PATENT DOCUMENTS 6,046,887 A 4/2000 Uozumi et al.
6,658,722 B1 12/2003 Kurita et al.
(Continued)

FOREIGN PATENT DOCUMENTS

JP 11-039626 A 2/1999
JP 2000-054164 A 2/2000
(Continued)

OTHER PUBLICATIONS

USPTO RR dated Dec. 12, 2012 in connection with U.S. Appl. No. 13/171,662.
(Continued)

*Primary Examiner* — Kevin Bernatz
(74) *Attorney, Agent, or Firm* — Ladas & Parry LLP

(57) ABSTRACT

The present invention provides a substrate for suspension that includes a first structural part including a metal supporting substrate, an insulating layer, a wiring layer, and a cover layer, and a second structural part formed so as to extend continuously from the first structural part and has no metal supporting substrate. A position of an edge of an upper surface of the insulating layer coincides with a position of an edge of the lower surface of the cover layer or the position of the edge of the upper surface of the insulating layer is positioned on a side closer to the wiring layer than to the position of the edge of the lower surface of the cover layer at a boundary region between the first structural part and the second structural part.

17 Claims, 16 Drawing Sheets

(51) Int. Cl.
*H05K 3/28* (2006.01)
*G11B 5/49* (2006.01)
*H05K 3/46* (2006.01)
*H05K 1/02* (2006.01)

(52) U.S. Cl.
CPC .............. *H05K 1/056* (2013.01); *H05K 3/28* (2013.01); *H05K 3/4644* (2013.01); *H05K 1/0298* (2013.01); *H05K 2201/0394* (2013.01); *H05K 2201/09781* (2013.01); *Y10T 428/1171* (2015.01); *Y10T 428/1179* (2015.01); *Y10T 428/1193* (2015.01)

(56) References Cited

U.S. PATENT DOCUMENTS

| | | | |
|---|---|---|---|
| 7,433,156 | B2 | 10/2008 | Zhu et al. |
| 7,764,467 | B2 | 7/2010 | Hanya et al. |
| 8,758,910 | B2* | 6/2014 | Miura .................. G11B 5/4833 360/234.6 |
| 2003/0053257 | A1 | 3/2003 | Wada et al. |
| 2003/0193753 | A1 | 10/2003 | Arai et al. |
| 2006/0190673 | A1* | 8/2006 | Arai .......................... G11B 5/10 711/101 |
| 2006/0291102 | A1 | 12/2006 | Honda |
| 2007/0047149 | A1 | 3/2007 | Motonishi |
| 2007/0188927 | A1* | 8/2007 | Zhu ...................... G11B 5/4833 360/245.3 |
| 2007/0227768 | A1 | 10/2007 | Shin |
| 2007/0247760 | A1* | 10/2007 | Hanya .................. G11B 5/4833 360/245.5 |
| 2008/0180850 | A1* | 7/2008 | Rice ..................... G11B 5/4826 360/245.9 |
| 2009/0310909 | A1* | 12/2009 | Ishii ........................ G02B 6/43 385/14 |
| 2010/0033875 | A1* | 2/2010 | Yoshida ............... G11B 5/4833 360/244.1 |
| 2010/0044094 | A1* | 2/2010 | Oka ........................ H05K 3/44 174/264 |
| 2010/0047626 | A1* | 2/2010 | Hitomi ................... G11B 5/486 428/810 |
| 2011/0091152 | A1 | 4/2011 | Nishio |
| 2011/0123145 | A1 | 5/2011 | Nishio |
| 2011/0235213 | A1 | 9/2011 | Ohnuki |
| 2013/0342936 | A1 | 12/2013 | Nishiyama et al. |

FOREIGN PATENT DOCUMENTS

| | | |
|---|---|---|
| JP | 2003-091805 A | 3/2003 |
| JP | 2003-151114 A | 5/2003 |
| JP | 2003-308668 A | 10/2003 |
| JP | 2007-012111 A | 1/2007 |
| JP | 2007-066444 A | 3/2007 |
| JP | 2007-133929 A | 5/2007 |
| JP | 2007-213793 A | 8/2007 |
| JP | 2007-273981 A | 10/2007 |
| JP | 2007-287296 A | 11/2007 |
| JP | 2008-041241 A | 2/2008 |
| JP | 2008-186567 | 8/2008 |

OTHER PUBLICATIONS

USPTO RR dated Feb. 6, 2013 in connection with U.S. Appl. No. 13/171,662.
USPTO NFOA dated May 6, 2013 in connection with U.S. Appl. No. 13/171,662.
USPTO NFOA dated Nov. 7, 2013 in connection wuth U.S. Appl. No. 13/171,662.
USPTO NOA mailed Feb. 19, 2014 in connection with U.S. Appl. No. 13/171,662.

* cited by examiner

SUBSTRATE FOR SUSPENSION, AND PRODUCTION PROCESS THEREOF

TECHNICAL FIELD

The present invention relates to a substrate for suspension which restrains the generation of cracks in the insulating layer at the boundary region between a region where a metal supporting substrate exists and a region where no metal supporting substrate exist. The present invention also relates to a substrate for suspension which reduces the influence of cracks generated in the insulating layer at the boundary region between a region where a metal supporting substrate exists and a region where no metal supporting substrate exist.

BACKGROUND ART

In recent years, there have been great demands for the increases in the amount of information processing and in information processing speed for personal computers under such circumstances including widespread use of the internet. Along with this, it has come to be necessary that hard disc drives (HDD) incorporated in a personal computer be increased in capacity and in information communication speed. For this, the substrate for suspension (flexure (integrated lead suspension)) used in HDDs need to have advanced functions.

As such a substrate for suspension, for example, Japanese Patent Laid-Open No. 2007-213793 discloses a flexure comprising a slider bonding pad part (tongue section), an outrigger and a crossbar. Further, wiring is formed on the outrigger in Japanese Patent Laid-Open No. 2007-213793. Moreover, Japanese Patent Laid-Open No. H11-039626 discloses a disk device suspension comprising a wiring layer arranged between the tongue section and the outrigger section. Japanese Patent Laid-Open No. 2007-287296 also discloses an out trace type flexure in which a trace member (wiring layer) is extended around the outside the outrigger section. Japanese Patent Laid-Open No. 2008-041241 also discloses a gimbal structure comprising a trace support tab that supports a conductive trace (wiring layer).

SUMMARY OF INVENTION

Technical Problem

In a conventional substrate for suspension, a wiring layer is formed on a metal supporting substrate with an insulating layer interposed therebetween. As substrate for suspensions having advanced functions are developed (for example, substrates for suspension having a lower stiffness are developed), a method is currently adopted in which a part of a metal supporting substrate is positively removed. When apart of the metal supporting substrate is removed, this causes the problem concerning easy generation of cracks to the insulating layer. It is because stress is concentrated on the insulating layer part formed above the boundary region between a region where a metal supporting substrate exists and a region where no metal supporting substrate exist.

The present invention has been made in view of the above problems and it is a primary object of the present invention to provide a substrate for suspension which restrains the generation of cracks in the insulating layer corresponding to the boundary region between a region where a metal supporting substrate exists and a region where no metal supporting substrate exist. Also, the present invention has been made in view of the above problems and it is a primary object of the present invention to provide a substrate for suspension which reduces the influence of cracks generated in the insulating layer at the boundary region between a region where a metal supporting substrate exists and a region where no metal supporting substrate exist.

Solution to Problem

In order to solve the above problem, the present invention provides a substrate for suspension comprising a metal supporting substrate, an insulating layer formed on the metal supporting substrate, a wiring layer formed on the insulating layer, and a cover layer formed to cover the wiring layer, wherein the substrate for suspension comprises a first structural part including the metal supporting substrate, the insulating layer, the wiring layer, and the cover layer, and a second structural part formed so as to extend continuously from the first structural part and has no metal supporting substrate, and wherein a position of an edge of an upper surface of the insulating layer coincides with a position of an edge of a lower surface of the cover layer or the position of the edge of the upper surface of the insulating layer is positioned on a side closer to the wiring layer than to the edge of the lower surface of the cover layer at a boundary region between the first structural part and the second structural part.

According to the present invention, the position of the edge of the upper surface of the insulating layer coincides with the position of the edge of the lower surface of the cover layer or is positioned on the side closer to the wiring layer than to the edge of the lower surface of the cover layer at the boundary region and therefore, the generation of cracks in the insulating layer can be restrained. For this, the breaking of wiring layer caused by stress concentration can be prevented.

In the above invention, it is preferable that the metal supporting substrate has a tongue section mounting for a device and an outrigger section positioned outside the tongue section, and the wiring layer is formed between the tongue section and the outrigger section in planar view. This is because that although cracks are easily generated in the insulating layer lying under the wiring layer at the boundary region in which the wiring layer is formed, the influence of the generation of cracks can be efficiently reduced.

In the above invention, it is preferable that the metal supporting substrate has a crossbar connecting the tongue section with the outrigger section; and the metal supporting substrate of the first structural part is the crossbar.

In the above invention, it is preferable that the metal supporting substrate has a trace support tab on an end surface of the tongue section side of the outrigger section and the metal supporting substrate of the first structural part is the trace support tab.

In the above invention, it is preferable that the metal supporting substrate has a base part supporting a bottom of the outrigger section and the metal supporting substrate of the first structural part is the base part.

In the above invention, the metal supporting substrate of the first structural part is preferably the tongue section.

Also, in the present invention, there is provided a substrate for suspension comprising a metal supporting substrate, an insulating layer formed on the metal supporting substrate, a wiring layer formed on the insulating layer, and a cover layer formed to cover the wiring layer, wherein the substrate for suspension comprises a first structural part including the metal supporting substrate, the insulating layer, the wiring layer, and the cover layer, and a second structural part formed so as to extend continuously from the first structural part and has no metal supporting substrate, wherein at least one of a width from an edge of the wiring layer to an edge of the insulating layer and a width from the edge of the wiring layer to an edge of the cover layer is locally large in planar view at a boundary region between the first structural part and the second structural part.

According to the present invention, at least one of the width from the edge of the wiring layer to the edge of the insulating layer and the width from the edge of the wiring layer to the edge of the cover layer is made locally large in planar view at the boundary region, and therefore, the influence of cracks generated in the insulating layer can be reduced. The wiring layer can be therefore prevented from breaking by stress concentration.

In the above invention, a position of the edge of the insulating layer preferably coincides with a position of the edge of the cover layer at the boundary region. This is because the generation of cracks can be intrinsically restrained.

In the above invention, a curved structural section is preferably formed so as to include the boundary region in planar view, on at least one of the insulating layer and the cover layer. This is because that the existence of the curved structural section allows the dispersion of stress, thereby enabling further restriction on the generation of cracks in the insulating layer at the boundary region.

Also, in the present invention, there is provided a substrate for suspension comprising a metal supporting substrate, an insulating layer formed on the metal supporting substrate, a wiring layer formed on the insulating layer, and a cover layer formed to cover the wiring layer, wherein the substrate for suspension comprises a first structural part including the metal supporting substrate, the insulating layer, the wiring layer, and the cover layer, and a second structural part formed to extend continuously from the first structural part and has no metal supporting substrate, wherein an auxiliary wiring layer is formed between an edge of the wiring layer and an edge of the insulating layer in planar view at the boundary region between the first structural part and the second structural part.

According to the above invention, the auxiliary wiring layer is formed between the edge of the wiring layer and the edge of the insulating layer in planar view at the boundary region so that the influence of cracks generated in the insulating layer can be reduced. The wiring layer can be therefore prevented from breaking or the like by stress concentration.

In the above invention, the surface of the auxiliary wiring layer is preferably covered with the cover layer.

In the above invention, a wiring plating section is preferably formed on a surface of the auxiliary wiring layer.

In the above invention, it is preferable that at least one of a width from the edge of the wiring layer to the edge of the insulating layer and a width from the edge of the wiring layer to the edge of the cover layer is locally large in planar view at the boundary region. This is because the influence of cracks generated in the insulating layer can be more reduced.

In the above invention, it is preferable that the metal supporting substrate has a tongue section mounting for a device and an outrigger section positioned outside the tongue section, and the wiring layer is formed between the tongue section and the outrigger section in planar view. This is because that although cracks are easily generated in the insulating layer at the boundary region where the wiring layer is formed, the influence of the generation of cracks can be efficiently reduced.

In the above invention, it is preferable that the metal supporting substrate has a crossbar connecting the tongue section with the outrigger section and the metal supporting substrate of the first structural part is the crossbar.

In the above invention, it is preferable that the metal supporting substrate has a trace support tab on an end surface of the tongue section side of the outrigger section; and the metal supporting substrate of the first structural part is the trace support tab.

In the above invention, it is preferable that the metal supporting substrate has a base part supporting a bottom of the outrigger section and the metal supporting substrate of the first structural part is the base part.

In the above invention, the metal supporting substrate of the first structural part is preferably the tongue section.

Also, in the present invention, there is provided a production process of substrate for suspension comprising: a metal supporting substrate, an insulating layer formed on the metal supporting substrate, a wiring layer formed on the insulating layer, a cover layer formed to cover the wiring layer, a first structural part including the metal supporting substrate, the insulating layer, the wiring layer, and the cover layer, and a second structural part formed to extend continuously from the first structural part and has no metal supporting substrate, the method comprises a step of: forming the insulating layer by carrying out wet etching such that a position of an edge of an upper surface of the insulating layer coincides with a position of an edge of a lower surface of the cover layer or the position of the edge of the upper surface of the insulating layer is positioned on a side closer to the wiring layer than to the edge of the lower surface of the cover layer at the boundary region between the first structural part and the second structural part.

According to the present invention, wet etching is carried out such that the position of the edge of the upper surface of the insulating layer coincides with the position of the edge of the lower surface of the cover layer or is positioned on the side closer to the wiring layer than to the edge of the lower surface of the cover layer to form the insulating layer so that a substrate for suspension which restrains the generation of cracks in the insulating layer can be obtained.

In the above invention, it is preferable to form the metal supporting substrate having a tongue section mounting for a device and an outrigger section positioned outside the tongue section, and to form the wiring layer between the tongue section and the outrigger section in planar view. This is because that although cracks are easily generated in such an insulating layer lying under the wiring layer at the boundary region where this wiring layer is formed, the influence of the generation of cracks can be efficiently reduced.

In the above invention, the cover layer is preferably used as a resist layer in the insulating layer formation step. This is because it is unnecessary to form a resist layer separately. Moreover, the insulating layer is highly bonded with the cover layer in usual from the viewpoint of securing the durability required for a product. Therefore, infiltration of an etching solution between both of the layers can be prevented, and the angle $\theta$ of the lower end section of the insulating layer can be increased.

In the above invention, the material of the cover layer is preferably a material having a lower etching rate for the etching solution than the material of the wiring layer. This is because such a material is useful for the resist layer.

Also, in the present invention, there is provided a production process of substrate for suspension comprising: a metal supporting substrate, an insulating layer formed on the metal supporting substrate, a wiring layer formed on the insulating layer, a cover layer formed to cover the wiring layer, a first structural part including the metal supporting substrate, the insulating layer, the wiring layer, and the cover layer, and a second structural part formed so as to extend continuously from the first structural part and has no metal supporting substrate, the method comprises a step of forming at least one of the insulating layer and the cover layer such that at least one of a width from an edge of the wiring layer to an edge of the insulating layer and a width from the edge of the wiring layer to an edge of the cover layer is locally large in planar view at a boundary region between the first structural part and the second structural part.

According to the present invention, at least one of the insulating layer and the cover layer is formed such that at least one of the width from the edge of the wiring layer to the edge of the insulating layer and the width from the edge of the wiring layer to the edge of the cover layer is locally large in planar view at the boundary region, and therefore, the substrate for suspension with reduced influence of cracks generated in the insulating layer can be obtained.

In the above invention, it is preferable to form the insulating layer and the cover layer such that a position of the edge of the insulating layer coincides with a position of the edge of the cover layer at the boundary region. This is because the generation of cracks can be intrinsically restrained.

Also, in the present invention, there is provided a production process of substrate for suspension comprising: a metal supporting substrate, an insulating layer formed on the metal supporting substrate, a wiring layer formed on the insulating layer, and a cover layer formed to cover the wiring layer, a first structural part including the metal supporting substrate, the insulating layer, the wiring layer, the cover layer, and a second structural part formed so as to extend continuously from the first structural part and has no metal supporting substrate, the method comprises a step of: a wiring layer formation step of forming an auxiliary wiring layer between an edge of the wiring layer and the edge of the insulating layer in planar view at the boundary region between the first structural part and the second structural part.

According to the above invention, an auxiliary wiring layer is formed between the edge of the wiring layer and the edge of the insulating layer at the boundary region and therefore, a substrate for suspension with reduced influence of cracks generated in the insulating layer can be obtained.

In the above invention, the wiring layer and auxiliary wiring layer are preferably formed simultaneously in the wiring layer formation step. This is because the production process can be simplified.

In the above invention, it is preferable to form a metal supporting substrate comprising a tongue section mounting for a device and an outrigger section positioned outside the tongue section and to form the wiring layer between the tongue section and the outrigger section in planar view. This is because that although cracks are easily generated in the insulating layer at the boundary region where the wiring layer is formed, the influence of the generation of cracks can be efficiently reduced.

Advantageous Effect of Invention

The substrate for suspension of the present invention takes effect of restraining the generation of cracks in the insulating layer at the boundary region between a region where a metal supporting substrate exists and a region where no metal supporting substrate exist. Also, the substrate for suspension of the present invention takes effect of reducing the influence of cracks generated in the insulating layer at the boundary region between a region where a metal supporting substrate exists and a region where no metal supporting substrate exist.

DESCRIPTION OF EMBODIMENTS

A substrate for suspension and a production process of substrate for suspension according to the present invention will be explained in detail.

A. Substrate for Suspension

First, the substrate for suspension of the present invention will be explained. The substrate for suspension of the present invention may be largely classified into three embodiments.

1. First Embodiment

The substrate for suspension of a first embodiment comprises a metal supporting substrate, an insulating layer formed on the metal supporting substrate, a wiring layer formed on the insulating layer, and a cover layer formed to cover the wiring layer, wherein the substrate for suspension comprises a first structural part including the metal supporting substrate, the insulating layer, the wiring layer, and the cover layer, and a second structural part formed so as to extend continuously from the first structural part and has no metal supporting substrate, and wherein a position of an edge of the upper surface of the insulating layer coincides with a position of an edge of a lower surface of the cover layer or the position of the edge of the upper surface of the insulating layer is positioned on a side closer to the wiring layer than to the edge of the lower surface of the cover layer at a boundary region between the first structural part and the second structural part.

Figure 1A:
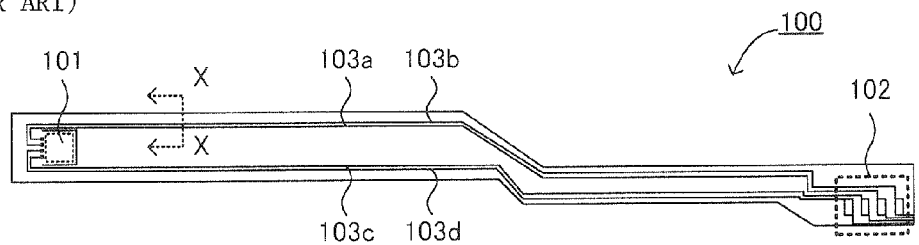
FIGS. 1A and 1B are each is a schematic diagram showing an example of a general substrate for suspension.
Figure 1B:
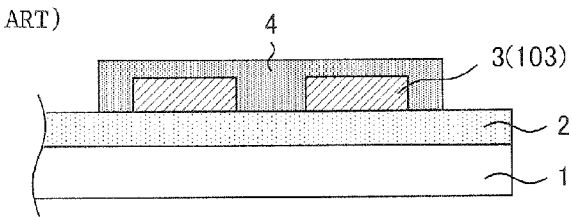

FIGS. 1A to 1B are each a schematic diagram showing an example of a general substrate for suspension. FIG. 1A is a schematic plan view of a substrate for suspension, and FIG. 1B is a sectional view along the line X-X of FIG. 1A. In FIG. 1A, the illustration of the cover layer is omitted for the sake of convenience. A substrate for suspension 100 shown in FIG. 1A comprises a device mounting area 101 formed on one end thereof, an external circuit substrate connecting area 102 formed on the other end, and a plurality of wiring layers 103a to 103d that electrically connect the device mounting area 101 with the external circuit substrate connecting area 102. The wiring layer 103a and the wiring layer 103b are a pair of wiring layers and similarly, the wiring layer 103c and the wiring layer 103d are also a pair of wiring layers. One of these two pairs of wiring layers is a writing wiring layer and the other is a reading wiring layer. On the other hand, as shown in FIG. 1B, the substrate for suspension has a metal supporting substrate 1, an insulating layer 2 formed on the metal supporting substrate 1, a wiring layer 3 formed on the insulating layer 2, and a cover layer 4 that covers the wiring layer 3.

Figure 2:
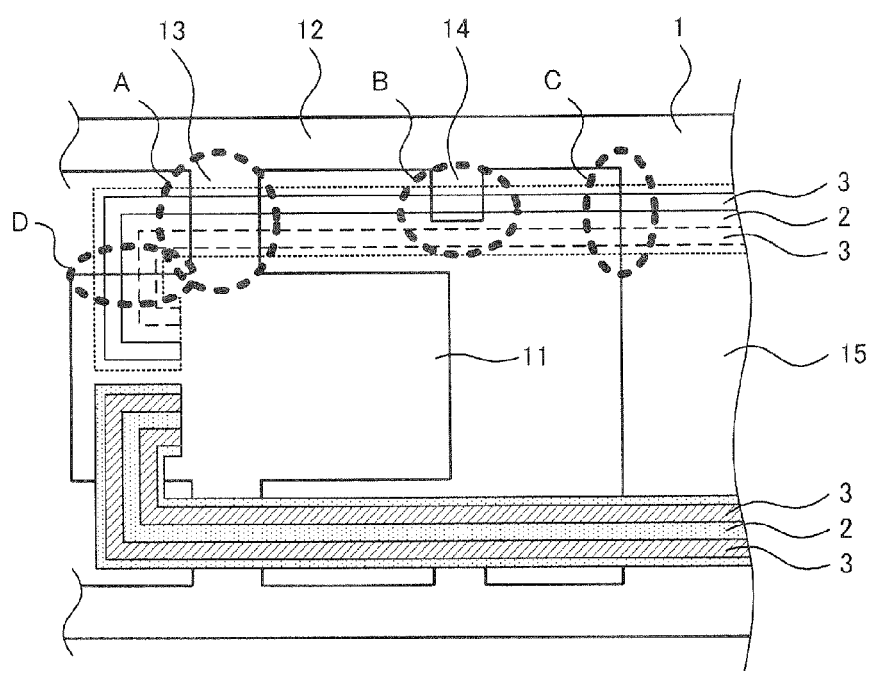
FIG. 2 is a schematic plan view showing the vicinity of a device mounting area of a substrate for suspension according to a first embodiment.

FIG. 2 is a schematic plan view showing the vicinity of the device mounting area of the substrate for suspension according to a first embodiment. In FIG. 2, the illustration of the cover layer is omitted for the sake of convenience, and the insulating layer and wiring layer on the upper half of the drawing are shown by the dotted line. The metal supporting substrate 1 in FIG. 2 has a tongue section 11 mounting for a device such as a magnetic hear slider (magnetic head mounted on read/write electrical circuit with suspension), an outrigger section 12 positioned outside the tongue section 11, a crossbar 13 connecting the tongue section 11 with the outrigger section 12, and a base part 15 supporting the bottom of the outrigger section 12. Moreover, in each of the areas A to D shown in FIG. 2, a first structural part including the metal supporting substrate 1, insulating layer 2, wiring layer 3, and cover layer (not shown) and a second structural part formed so as to extend continuously from the first structural part and has no metal supporting substrate 1 are formed.

Also, in the first embodiment, as shown in FIG. 2, the wiring layer 3 is preferably formed between the tongue section 11 and the outrigger section 12 in planar view. This is because that although cracks are easily generated in the insulating layer under the wiring layer at the boundary region where the wiring layer is formed, the influence of the generation of cracks can be efficiently reduced. In Japanese Patent Laid-Open No. 2007-213793 mentioned above, it is disclosed that a wiring layer is formed on the outrigger section. On the other hand, there are technologies in which the outrigger section is irradiated with a laser to adjust the pitch/roll angle of the gimbal. If these technologies are applied to Japanese Patent Laid-Open No. 2007-213793, the wiring layer is easily deteriorated by the influence of the heat generated by laser radiation. Also, the stiffness of the wiring layer is a hindrance to the adjustment of the pitch/roll angle of the gimbal. For this reason, it is preferable to arrange the wiring layer outside or inside the outrigger section. Here, if the wiring layer is arranged outside the outrigger section, an out-trace type substrate for suspension as shown in Japanese Patent Laid-Open No. 2007-287296 is obtained. There is the possibility that this out-trace type substrate for suspension has difficulty in flight-height control because the wiring layer is largely affected by the wind pressure when a disk is rotated. Also, since no outrigger section exists outside the wiring layer, the wiring layer is susceptible to a damage. As mentioned above, the wiring layer is preferably formed between the tongue section and the outrigger section in planar view from the viewpoint of preventing the wiring layer from being deteriorated by laser radiation, from the viewpoint of reducing the influence of wind pressure when a disk is rotated and from the viewpoint of preventing the wiring layer from being damaged.

Figure 3:
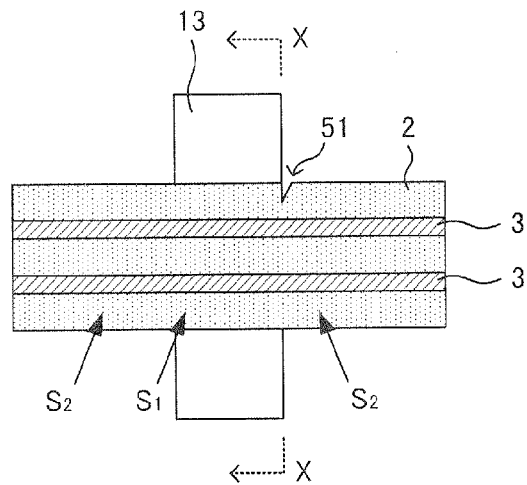
FIG. 3 is a schematic plan view showing the vicinity of a crossbar.

On the other hand, FIG. 3 is a schematic plan view showing the vicinity of the crossbar. In FIG. 3, the wiring layer 3 is arranged so as to intersect the crossbar 13. There is the problem in that cracks 51 are easily generated in the insulating layer 2 existing above the boundary region between a first structural part $S_1$ including the crossbar 13, insulating layer 2, wiring layer 3, and cover layer (not shown) which are laminated in this order and a second structural part $S_2$ including the insulating layer 2, wiring layer 3, and cover layer (not shown) and no crossbar 13 which are laminated in this order. Examples of the reason of the generation of cracks 51 include stress concentration on the substrate for suspension in use (for example, stress concentration caused by the oscillation of a device such as a magnetic head slider) and stress concentration on the substrate for suspension in production (for example, stress concentration caused by liquid treatment after the crossbar 13 is formed and stress concentration when the substrate for suspension is conveyed in the production stage). When cracks are generated and developed, it is assumed that the stress directly affects the wiring layer and the wiring layer is corroded or burn out in the worst case.

Figure 4A:
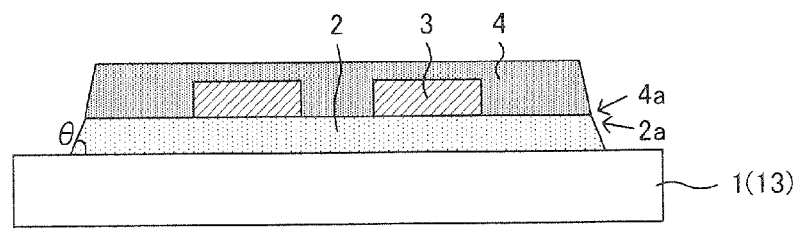
FIGS. 4A to 4C are each a sectional view along the line X-X of FIG. 3.
Figure 4B:
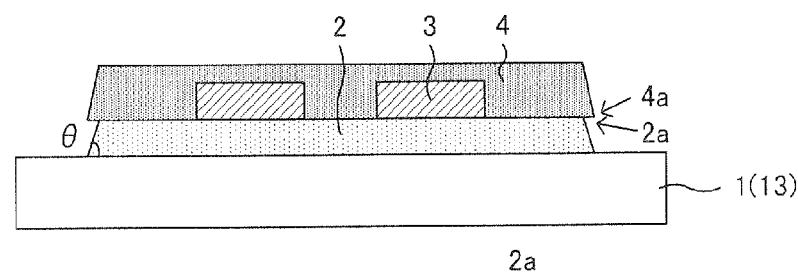
Figure 4C:
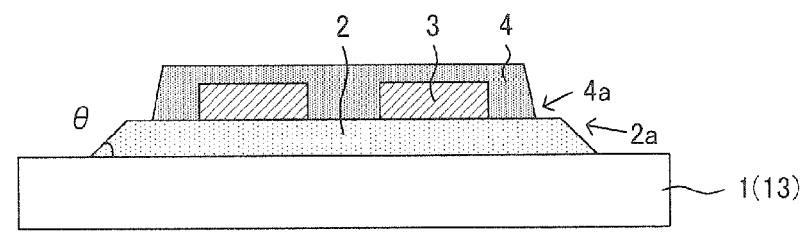

FIGS. 4A to 4C are each a sectional view along the line X-X in FIG. 3, showing a sectional view of the boundary region between the first structural part $S_1$ and the second structural part $S_2$. When the insulating layer in the first embodiment is formed, for example, by wet etching, the insulating layer usually has a trapezoidal shape in section.

The substrate for suspension of the first embodiment is primarily characterized by the feature that the position of the edge 2a of the upper surface of the insulating layer 2 coincides with the position of the edge 4a of the lower surface of the cover layer 4 (FIG. 4A) or is positioned on the side (inner side) closer to the wiring layer 3 than to the edge 4a of the lower surface of the cover layer 4 (FIG. 4B) at the boundary region. The edge of the insulating layer 2 is reinforced and the generation of cracks can be therefore restrained by that feature. Also, the insulating layer 2 is highly bonded with the cover layer 4 in usual from the viewpoint of securing the durability required for a product. Therefore, the infiltration of an etching solution between both layers can be prevented, the angle θ of the lower end section of the insulating layer 2 can be increased, and the generation of cracks can be restrained also thanks to this point.

On the other hand, as shown in FIG. 4C, when the position of the upper end 2a of the insulating layer 2 is on a considerably outer side of the edge of the lower surface 4a of the cover layer 4, the edge of the insulating layer 2 is not reinforced and therefore cracks are easily generated. Moreover, the insulating layer 2 is less bonded with the resist layer in the wet etching in usual. Therefore, an etching solution infiltrates between both layers, so that the angle θ of the lower end section of the insulating layer 2 becomes small, and cracks are easily generated thanks to this point.

According to the first embodiment as mentioned above, the position of the edge of the upper surface of the insulating layer coincides with the position of the edge of the lower surface of the cover layer or is positioned on the side closer to the wiring layer than to the edge of the lower surface of the cover layer at the boundary region and therefore, the generation of cracks in the insulating layer can be restrained. For this reason, the breaking of wire layer caused by stress concentration can be prevented. Particularly, there is a recent need for the development of a thin insulating layer and therefore, cracks are easily generated in the insulating layer. However, according to the first embodiment, the generation of cracks can be efficiently restrained in such a case.

With regard to the substrate for suspension of the first embodiment, the member and structure of the substrate for suspension will be explained separately.

(1) Member of the Substrate for Suspension

First, the member of the substrate for suspension of the first embodiment will be explained. The substrate for suspension of the first embodiment comprises a metal supporting substrate, an insulating layer, a wiring layer, and a cover layer.

The metal supporting substrate in the first embodiment functions as the support of the substrate for suspension. The material of the metal supporting substrate is preferably a metal having spring properties. Specific examples of the material of the metal supporting substrate may include SUS. Also, the thickness of the metal supporting substrate is for example, in a range from 10 μm to 20 μm though it differs depending on the type of material.

The insulating layer in the first embodiment is formed on the metal supporting substrate. Although any material may be used as the material of the insulating layer as long as it has insulating ability, resins are given as examples. Specific examples of the above resins may include a polyimide resin, polybenzoxazole resin, polybenzoimidazole resin, acrylic resin, polyether nitrile resin, polyether sulfone resin, polyethylene terephthalate resin, polyethylene naphthalate resin and polyvinyl chloride resin. Among these resins, a polyimide resin is preferable. This is because the polyimide resin is superior in insulating ability, heat resistance and chemical resistance. Also, the material of the insulating layer may be either a photosensitive material or non-photosensitive material. The thickness of the insulating layer is, for example, in a range from preferably 5 μm to 30 μm, more preferably 5 μm to 18 μm and even more preferably 5 μm to 12 μm.

The wiring layer in the first embodiment is formed on the insulating layer. Although any material may be used as the wiring layer insofar as it has conductivity, examples of the material may include metals. Among these metals, copper (Cu) is preferable. Also, the material of the wiring layer may be rolled copper or electrolyte copper. The thickness of the wiring layer is in a range from preferably 5 μm to 18 μm and more preferably 9 μm to 12 μm. Also, a wiring plating section may be formed on the surface of apart of the wiring layer. This is because the formation of the wiring plating section can prevent the deterioration (for example, corrosion) of the wiring layer. Particularly, in the first embodiment, this wiring plating section is preferably formed on the terminal section which connects with devices or an external circuit substrate. Although no particular limitation is imposed on the type of the wiring plating section, examples of the plating include Ni plating and Au plating. The thickness of the wiring plating section is within a range from 0.1 μm to 4.0 μm.

The cover layer in the first embodiment is formed so as to cover the wiring layer 3. The deterioration (for example, corrosion) of the wiring layer can be prevented by the cover layer. Examples of the material of the cover layer may include resins exemplified as the material of the above-mentioned insulating layer. Among these resins, a polyimide resin is preferable. Also, the material of the cover layer may be either a photosensitive material or a non-photosensitive material. Also, the thickness of the cover layer is preferably in a range from 2 μm to 30 μm and more preferably in a range from 2 μm to 10 μm.

(2) Structure of the Substrate for Suspension

Next, the structure of the substrate for suspension of the first embodiment will be explained. The substrate for suspension of the first embodiment includes a first structural part including a metal supporting substrate, an insulating layer, a wiring layer and a cover layer which are laminated in this order. As the wiring layer in the first structural part, a plurality of wiring layers having various functions may be used. Examples of the wiring layer include writing wiring layers, reading wiring layers, noise shielding wiring layers, crosstalk preventive wiring layers, power source wiring layers, ground wiring layers, flight-height control wiring layers, censor wiring layers, actuator wiring layers, and heat assist wiring layers. Also, the substrate for suspension of the first embodiment includes a second structural part formed so as to extend continuously from the first structural part and has no metal supporting substrate. The second structural part corresponds to, for example, a structural part obtained by removing only the metal supporting substrate from the first structural part.

Figure 5A:
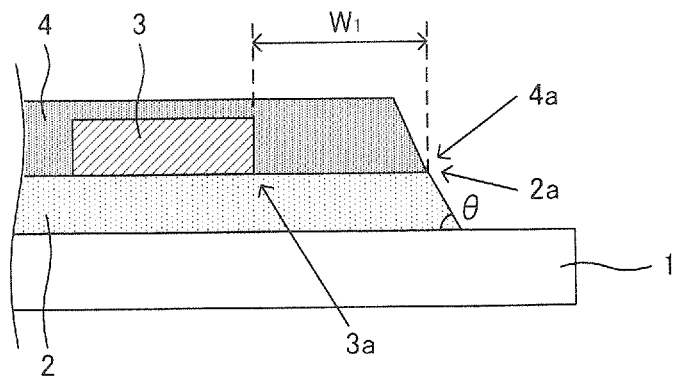
FIGS. 5A and 5B are each a schematic sectional view for explaining the substrate for suspension according to the first embodiment.

Also, the substrate for suspension of the first embodiment is characterized by the feature that, as shown in FIG. 5A, the position of the edge 2a of the upper surface of the insulating layer 2 coincides with the position of the edge 4a of the lower surface of the cover layer 4 at the boundary region between the first structural part and the second structural part. The term "coincide" in the first embodiment means not only strict coincidence but also substantial coincidence. The term "substantial coincidence" means that the position of the edge 4a of the lower surface of the cover layer 4 is positioned on the side closer to the wiring layer 3 than to the position of the edge 2a of the upper surface of the insulating layer 2 and the width between both edges is 10 μm or less (preferably 5 μm or less). When a resist pattern is used to form the insulating layer 2 as shown in FIGS. 16A to 16E which will be explained later, there is the case where a substrate for suspension is obtained in which the edge 4a of the lower surface of the cover layer 4 is positioned on the side closer to the wiring layer 3 than to the edge 2a of the upper surface of the insulating layer 2. Also, when the width between the edge 3a of the lower surface of the wiring layer 3 and the edge 4a of the lower surface of the cover layer 4 is $W_1$, the value of $W_1$ is preferably 10 μm or more and more preferably 15 μm or more. This is because that when the value of $W_1$ is too small, there is the possibility that the wiring layer 2 is exposed from the cover layer 4 by the relative slippage of the cover layer 4 to the wiring layer 3 when the cover layer 4 is formed on the wiring layer 3. The value of $W_1$ is preferably, for example, 30 μm or less and more preferably 20 μm or less. This is because that when the value of $W_1$ is too large, the entire width of the wiring section is wider, which brings about layout difficulty because of the space limit. Also, the angle θ of the lower end section of the insulating layer 2 is preferably 30 degrees or more, more preferably 40 degrees or more and even more preferably 50 degrees or more.

Figure 5B:
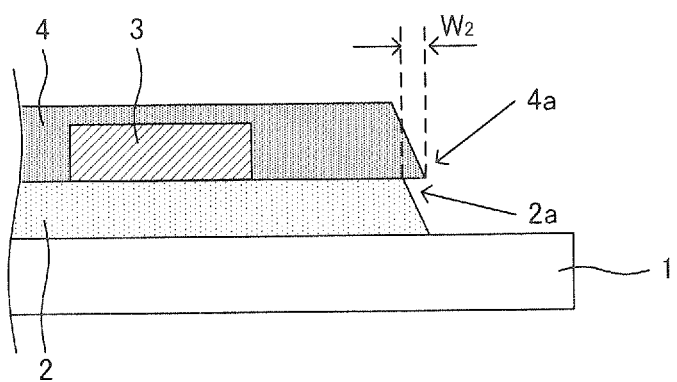

Also, the substrate for suspension of the first embodiment is characterized by the feature that, as shown in FIG. 5B, the position of the edge 2a of the upper surface of the insulating layer 2 is positioned on the side closer to the wiring layer 3 than to the position of the edge 4a of the lower surface of the cover layer 4 at the boundary region between the first structural part and the second structural part. When the width from the edge 4a of the lower surface of the cover layer 4 to the edge of 2a of the upper surface of the insulating layer 2 is $W_2$, the value of $W_2$ is preferably 15 μm or less, more preferably 10 μm or less and even more preferably 5 μm or less. This is because the generation of cracks can be restrained more efficiently if the width is within the above range.

Also, in the first embodiment, the insulating layer and the cover layer are preferably made of the same material. This is because the adhesion between both layers is more improved. When the adhesion between both layers is high, the infiltration into both layers can be prevented, so that the angle θ of the lower end section of the insulating layer can be increased. As a result, the generation of cracks in the insulating layer can be restrained. The term "same material" in the first embodiment means materials having the same fundamental skeleton. Particularly, in the first embodiment, the materials of the insulating layer and cover layer are respectively preferably a polyimide resin. Moreover, the material of the cover layer is preferably a material having a lower etching rate for an etching solution than the material of the cover layer.

Next, the boundary region in the first embodiment will be explained. There is no particular limitation to the boundary region as long as it is a region of the boundary between the aforementioned first structural part and second structural part. Examples of the boundary region may include the regions A to D in the above FIG. 2. The region A in FIG. 2 is shown in an embodiment including a crossbar 13 as the metal supporting substrate of the first structural part. Both ends of the crossbar 13 are boundaries between a region where the metal supporting substrate exists and a region where no metal supporting substrate exist. Particularly, the region A is largely affected by the oscillation of devices when the substrate for suspension is used. Therefore, the edge of the upper surface of the insulating layer preferably coincides with the edge of the lower surface of the cover layer or is positioned on the side closer to the wiring layer than to the edge of the lower surface of the cover layer in this boundary region. Moreover, since, among the region A, the boundary region on the side closer to the tongue section 11 is easily affected by distortion and the like, the edge of the position of the upper surface of the insulating layer preferably coincides with the edge of the lower surface of the cover layer or is positioned on the side closer to the wiring layer than to the edge of the lower surface of the cover layer at the boundary region on the side closer to the tongue section 11.

Figure 6:
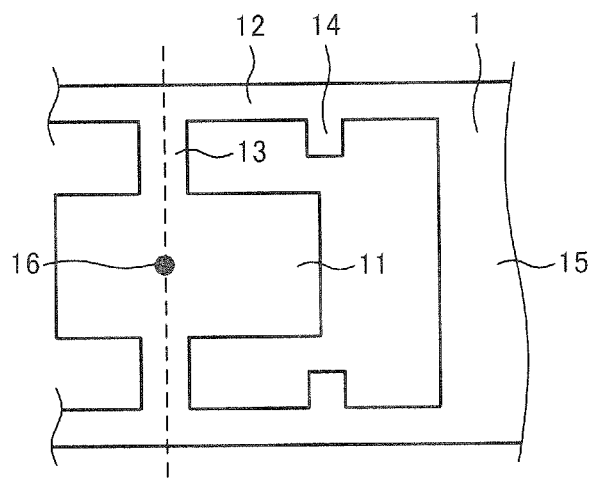
FIG. 6 is a schematic plan view for explaining a metal supporting substrate in the first embodiment.

Also, although particular limitation is not imposed on the position of the crossbar in the first embodiment as long as it is a position at which the tongue section and outrigger section can be connected with each other, the crossbar is preferably formed on the end surface of the tongue section in the short-side direction of the substrate for suspension. In the first embodiment, particularly, the crossbar 13 is preferably formed so as to overlap on the substrate for suspension in the short-side direction in the center 16 of oscillation of a device as shown in FIG. 6. This is because that the oscillation of the device can be minimized, for example, in the generation of HDI (Head Disk Interface).

The region B in FIG. 2 is shown in an embodiment including a trace support tab 14 as the metal supporting substrate of the first structural part. Both ends of the trace support tab 14 are boundaries between a region where the metal supporting substrate exists and a region where no metal supporting substrate exist. Similarly, the region C in FIG. 2 is shown in an embodiment including a base section 15 as the metal supporting substrate of the first structural part, and the region D in FIG. 2 is shown in an embodiment including a tongue section as the metal supporting substrate of the first structural part.

In the first embodiment, examples of devices mounted on a device mounting area may include a magnetic head slider, actuator and semiconductor. The above actuator may be those comprising a magnetic head or those comprising no magnetic head.

2. Second Embodiment

Next, a second embodiment of the substrate for suspension according to the present invention will be explained. The substrate for suspension of the second embodiment comprises a metal supporting substrate, an insulating layer formed on the metal supporting substrate, a wiring layer formed on the insulating layer, and a cover layer formed to cover the wiring layer, wherein the substrate for suspension comprises a first structural part including the metal supporting substrate, the insulating layer, the wiring layer, and the cover layer, and a second structural part formed so as to extend continuously from the first structural part and has no metal supporting substrate, and wherein at least one of a width from an edge of the wiring layer to an edge of the insulating layer and a width from the edge of the wiring layer to an edge of the cover layer be locally larger in planar view at a boundary region between the first structural part and the second structural part.

Figure 7A:
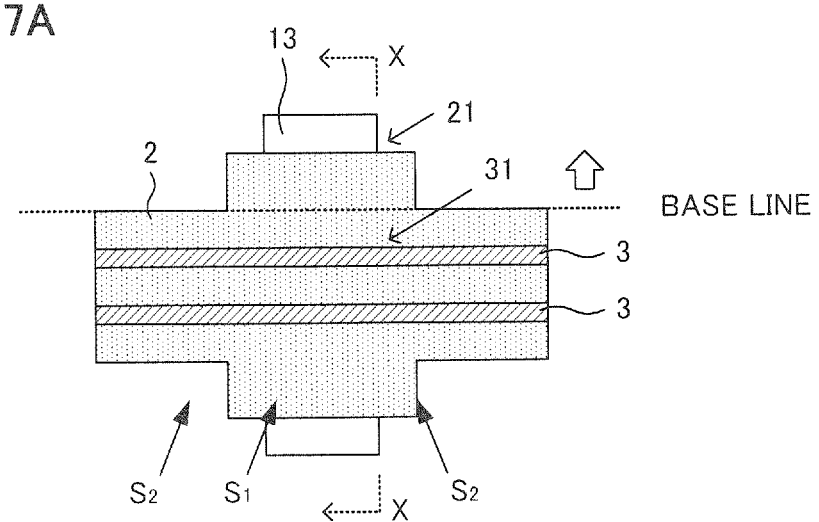
FIGS. 7A and 7B are each a schematic plan view for explaining a substrate for suspension according to a second embodiment.
Figure 7B:
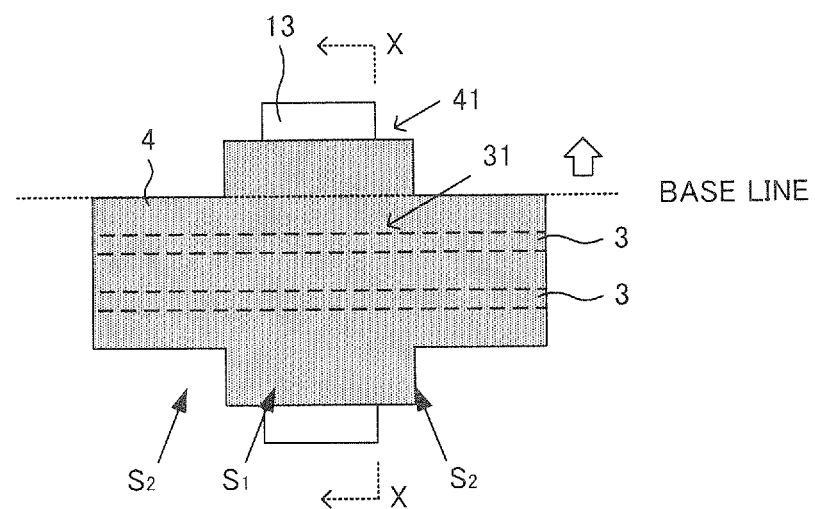

FIGS. 7A and 7B are each a schematic plan view showing the vicinity of the crossbar like that of FIG. 3. In the substrate for suspension of the second embodiment, the width from the edge 31 of the wiring layer 3 to the edge 21 of the insulating layer 2 is preferably locally larger in planar view at the boundary region (FIG. 7A). Also, in the substrate for suspension of the second embodiment, the width from the edge 31 of the wiring layer 3 to the edge 41 of the cover layer 4 is preferably locally large in planar view at the boundary region (FIG. 7B). Also, though not shown in the drawings, in the second embodiment, both of the width from the edge 31 of the wiring layer 3 to the edge 21 of the insulating layer 2 and the width from the edge 31 of the wiring layer 3 to the edge 41 of the cover layer 4 are preferably locally large in planar view at the boundary region.

Also, in the second embodiment, the description "the width is locally large" may be defined as follows. Since the insulating layer is formed for the purpose of insulating the wiring layer, it is basically formed corresponding to the wiring pattern of the wiring layer. For this reason, the base line of the insulating layer 2 can be easily identified as shown in FIG. 7A. This base line can be easily identified regardless of whether it is a linear line or curved line. For this reason, if the width from the edge 31 to the edge 21 at the boundary region is larger than the width from the edge 31 to the edge 21 on this base line, the description "the width is locally large" can be identified. This is the same to the cover layer in FIG. 7B.

Figure 8A:
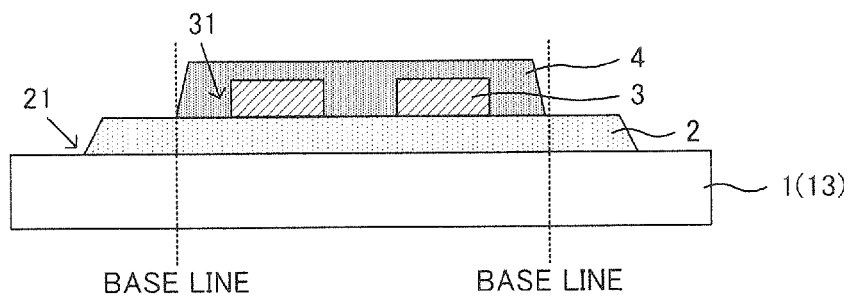
FIGS. 8A to 8C are each a schematic sectional view for explaining the substrate for suspension according to the second embodiment.
Figure 8B:
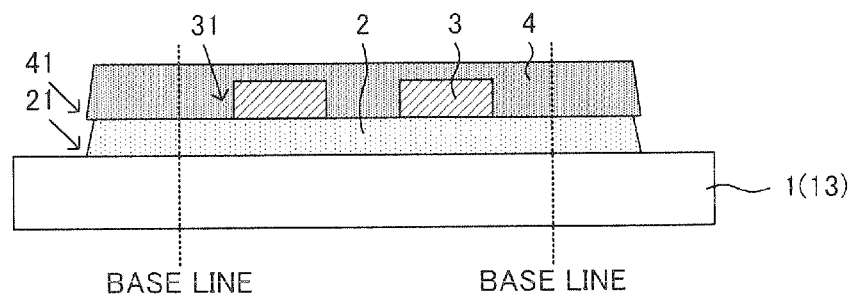
Figure 8C:
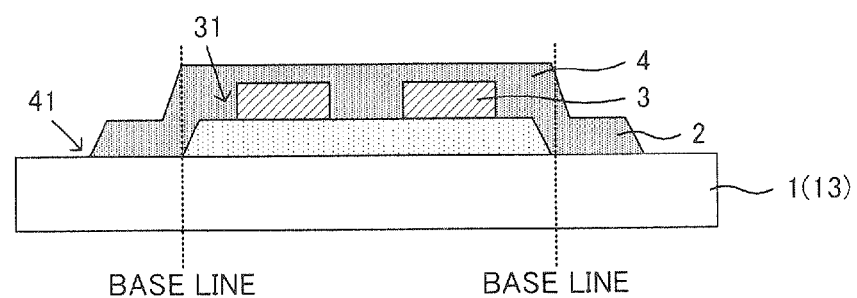

FIG. 8A is a sectional view along the line X-X of FIG. 7A. In FIG. 7A, the width from the edge 31 of the wiring layer 3 to the edge 21 of the insulating layer 2 is locally large at the boundary region. On the other hand, FIGS. 8B and 8C respectively correspond to a sectional view along the line X-X of FIG. 7B. In FIG. 8B, the width from the edge 31 of the wiring layer 3 to the edge 21 of the insulating layer 2 and width from the edge 31 of the wiring layer 3 to the edge 41 of the cover layer 4 are locally large at the boundary region. In FIG. 8C, the width from the edge 31 of the wiring layer 3 to the edge 41 of the cover layer 4 is locally large at the boundary region. When the insulating layer in the second embodiment is formed, for example, by wet etching, the insulating layer usually has a trapezoidal shape in section.

According to the second embodiment as mentioned above, at least one of the width from the edge of the wiring layer to the edge of the insulating layer and the width from the edge of the wiring layer to the edge of the cover layer in planar view at the boundary region is made to be locally large and therefore, the influence of cracks generated in the insulating layer can be reduced. For this reason, the wiring layer can be, for example, prevented from being burned out by stress concentration. Particularly, there is a recent need for the development of a thin insulating layer and therefore, cracks tend to be easily generated in the insulating layer. However, according to the second embodiment, the influence of cracks can be efficiently reduced.

With regard to the substrate for suspension of the second embodiment, the member and structure of the substrate for suspension will be explained separately.

(1) Member of the Substrate for Suspension

First, the member of the substrate for suspension of the second embodiment will be explained. The substrate for suspension of the second embodiment has a metal supporting substrate, an insulating layer, a wiring layer, and a cover layer. These members are the same as those described in the aforementioned "1. First embodiment (1) Member of the substrate for suspension" and the explanations of these members are therefore omitted here.

(2) Structure of the Substrate for Suspension

Next, the structure of the substrate for suspension of the second embodiment will be explained. The first structural part and second structural part of the substrate for suspension in the second embodiment are the same as those described in the aforementioned "1. First embodiment (2) Structure of the substrate for suspension" and the explanations of these structures are therefore omitted here.

Figure 9A:
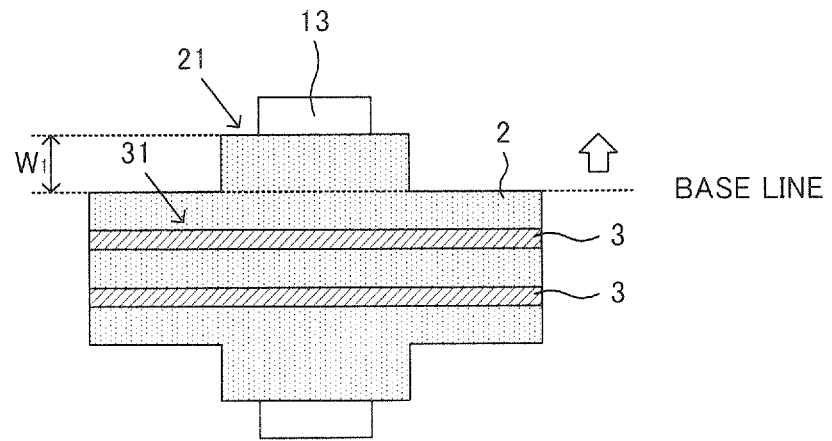
FIGS. 9A and 9B are each a schematic plan view for explaining the substrate for suspension according to the second embodiment.

Also, the substrate for suspension in the second embodiment is characterized by the feature that at least one of the width from the edge of the wiring layer to the edge of the insulating layer and the width from the edge of the wiring layer to the edge of the cover layer is locally large in planar view at the boundary region. As shown in FIG. 9A, when the width from the base line of the insulating layer 2 to the edge 21 of the insulating layer 2 is $W_1$, the value of $W_1$ is preferably 30 µm or more, more preferably 50 µm or more, and even more preferably 70 µm or more. On the other hand, there is no particular restriction on the upper limit of W. Though the explanations with reference to FIG. 9A are furnished as to the case where the width from the edge 31 of the wiring layer 3 to the edge 21 of the insulating layer 2 is locally large, this is the same to the case where the width from the edge of the wiring layer to the edge of the cover layer is locally large.

Figure 9B:
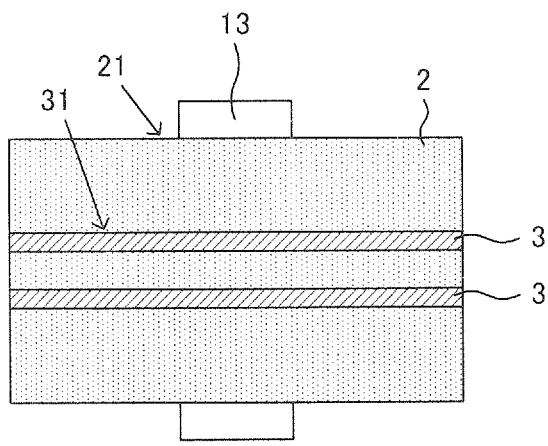

Also, the influence of cracks generated in the insulating layer can also be reduced by entirely increasing the width from the edge 31 of the wiring layer 3 to the edge 21 of the insulating layer 2 over the whole range of these edges as shown in FIG. 9B. Although not illustrated in the drawing, the influence of cracks generated in the insulating layer can also be reduced by increasing the width from the edge of the wiring layer to the edge of the cover layer over the whole range of these edges. However, the adoption of this structure requires a space enough to spare with many restrictions on design freedom.

Figure 10:
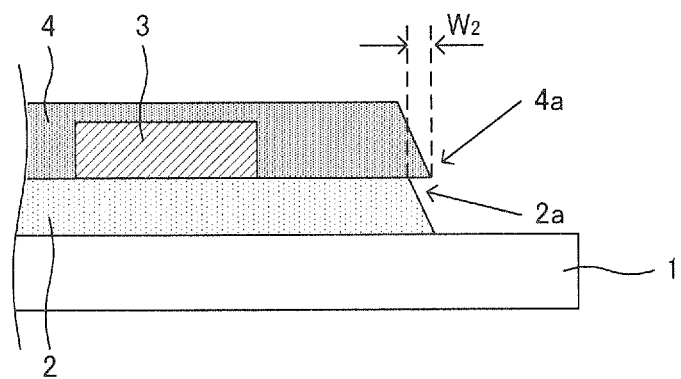
FIG. 10 is a schematic sectional view for explaining the substrate for suspension according to the second embodiment.

Also, in the substrate for suspension of the second embodiment as shown in FIG. 8B, the width from the edge 31 of the wiring layer 3 to the edge 21 of the insulating layer 2 and the width from the edge 31 of the wiring layer 3 to the edge 41 of the cover layer 41 are preferably locally large at the boundary region. This is because that the development of cracks can be efficiently restrained in the laminated parts of the insulating layer and cover layer by forming a projected section of the both. In this case, the position of the edge of the insulating layer and the position of the edge of the cover layer may coincide with each other. Though the both edges may be deviated from each other, they are preferably coincides with each other. This is because the generation of cracks can be intrinsically restrained. The above term "coincide" means that the position of the edge of the upper surface of the insulating layer coincides with the position of the edge of the lower surface of the cover layer. Also, the term "coincide" means not only strict coincidence but also substantial coincidence. The term "substantial coincidence" means that the width $W_2$ from the edge 4a of the lower surface of the cover layer 4 to the edge 2a of the upper surface of the insulating layer 2 is 10 µm or less (preferably 5 µm or less) as shown in FIG. 10. In this case, the edge of the lower surface of the cover layer may be positioned either inside or outside the edge of the upper surface of the insulating layer.

Also, in the case where the insulating layer is formed by wet etching and the edge of the insulating layer is made to coincide with the edge of the cover layer at the boundary region, the angle θ of the lower end section of the insulating layer can be increased, and the generation of cracks can be restrained. Generally, the insulating layer and the cover layer are strongly bonded with each other from the viewpoint of securing the durability required for a product. This can prevent an etching solution from infiltrating between both layers and therefore, the angle θ of the lower end section of the insulating layer can be increased. The generation of cracks can be restrained by increasing the angle. In the second embodiment, the angle θ of the lower end section of the insulating layer is preferably 30 degrees or more, more preferably 40 degrees or more and even more preferably 50 degrees or more.

In the second embodiment, the insulating layer and the cover layer are preferably made of the same type of material. This reason is the same as that described in "1. First embodiment (2) Structure of the substrate for suspension" and is therefore omitted here.

The boundary region in the second embodiment is the same as that (boundary region with reference to FIG. 2) described in the aforementioned first embodiment. Particularly, the region A is largely affected by the oscillation of devices when the substrate for suspension is used. Therefore, it is preferable that at least one of the width from the edge of the wiring layer to the edge of the insulating layer and the width from the edge of the wiring layer to the edge of the cover layer is locally large in planar view at the boundary region. Moreover, since, among the region A, the boundary region on the side closer to the tongue section 11 is easily affected by distortion and the like, it is preferable that at least one of the width from the edge of the wiring layer to the edge of the insulating layer and the width from the edge of the wiring layer to the edge of the cover layer is locally larger at the boundary region on the side closer to the tongue section 11.

Also, though there is no particular limitation to the position of the crossbar in the second embodiment insofar as the crossbar can connect with the tongue section and outrigger section, the crossbar is preferably formed on the end surface of the tongue section in the direction of the short side of the substrate for suspension. This reason is the same as that described in the above paragraph "1. First embodiment (2) Structure of the substrate for suspension" and the explanations of this reason are omitted here.

Figure 11A:
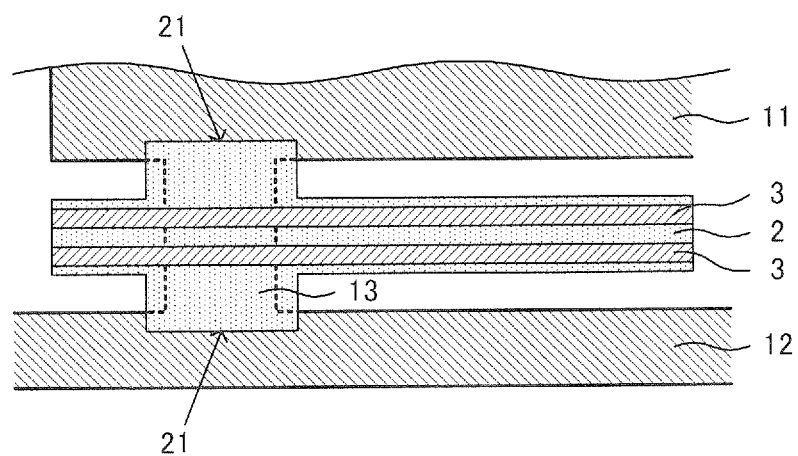
FIGS. 11A and 11B are each a schematic plan view for explaining the substrate for suspension according to the second embodiment.
Figure 11B:
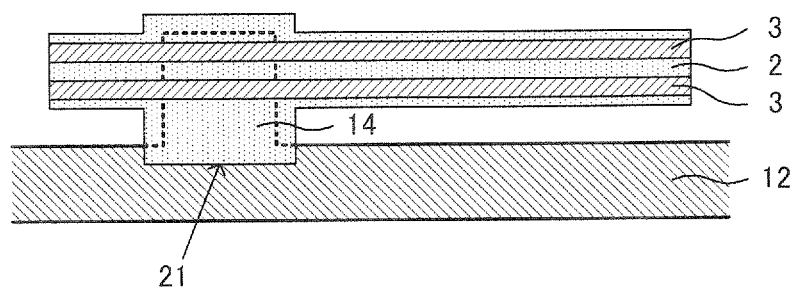

Also, in the second embodiment, the insulating layer 2 is preferably formed on the crossbar 13 such that the edge 21 thereof reaches the tongue section 11 as shown in FIG. 11A. Similarly, the insulating layer 2 is preferably formed on the crossbar 13 such that the edge 21 thereof reaches the outrigger section 12. Also, the insulating layer 2 is preferably formed on the support trace tab 14 such that the edge 21 thereof reaches the outrigger section 12 as shown in FIG. 11B. This is because such a structure enables effective restriction of the generation of cracks. Though the explanations with reference to FIGS. 11A and 11B are furnished as to the case where the width from the edge 31 of the wiring layer 3 to the edge 21 of the insulating layer 2 is locally large, this is the same to the case where the width from the edge of the wiring layer to the edge of the cover layer is locally large.

Figure 12A:
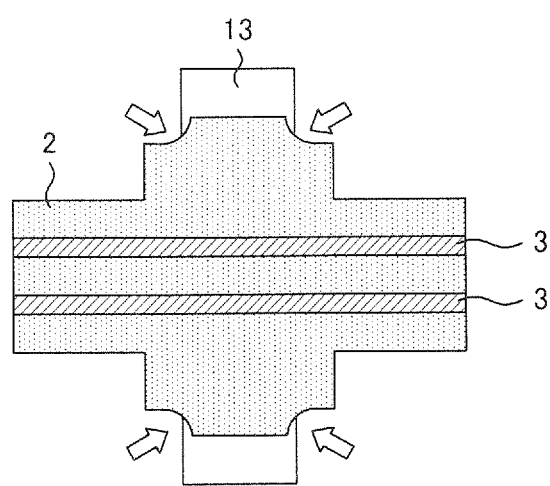
FIGS. 12A and 12B are each a schematic plan view for explaining the substrate for suspension according to the second embodiment.
Figure 12B:
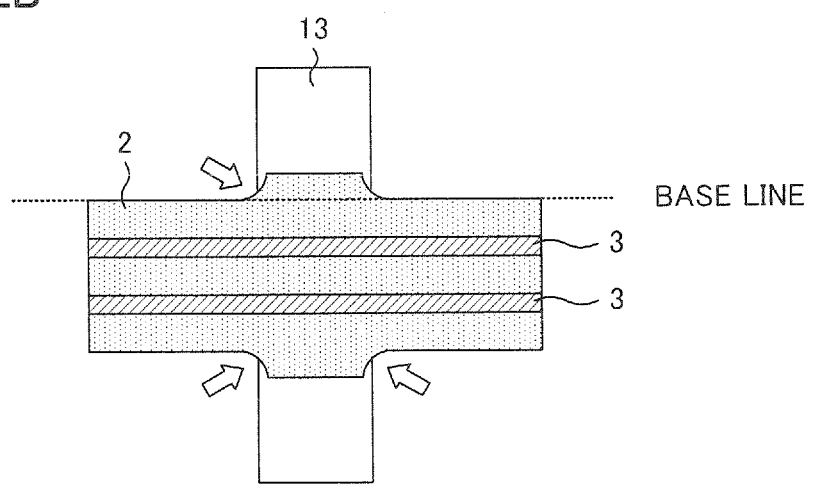

Also, in the second embodiment, a curved structural section is preferably formed so as to include the boundary region in planar view on at least one of the insulating layer and the cover layer. This is because that the existence of the curved structural section allows the dispersion of stress, thereby enabling further restriction on the generation of cracks in the insulating layer at the boundary region. Examples of the curved structural section may include a curved structural section formed at the tip of the projected section of the insulating layer 2 as shown in FIG. 12A and a curved structural section formed so as to extend continuously from the base line of the insulating layer 2 as shown in FIG. 12B. The cover layer 4 may be formed with the same curved structural section although not illustrated in FIGS. 12A and 12B.

Also, the devices mounted on the device mounting area in the second embodiment are the same as those described in the above paragraph "1. First embodiment (2) Structure of the substrate for suspension" and explanations of these devices are omitted here. Other items are also basically the same as those described in the first embodiment.

3. Third Embodiment

Next, a third embodiment of the substrate for suspension according to the present invention will be explained. The substrate for suspension of the third embodiment comprises a metal supporting substrate, an insulating layer formed on the metal supporting substrate, a wiring layer formed on the insulating layer, and a cover layer formed to cover the wiring layer, wherein the substrate for suspension comprises a first structural part including the metal supporting substrate, the insulating layer, the wiring layer and the cover layer, and a second structural part formed so as to extend continuously from the first structural part and has no metal supporting substrate, and wherein an auxiliary wiring layer is formed between an edge of the wiring layer and an edge of the insulating layer in planar view at a boundary region between the first structural part and the second structural part.

Figure 13A:
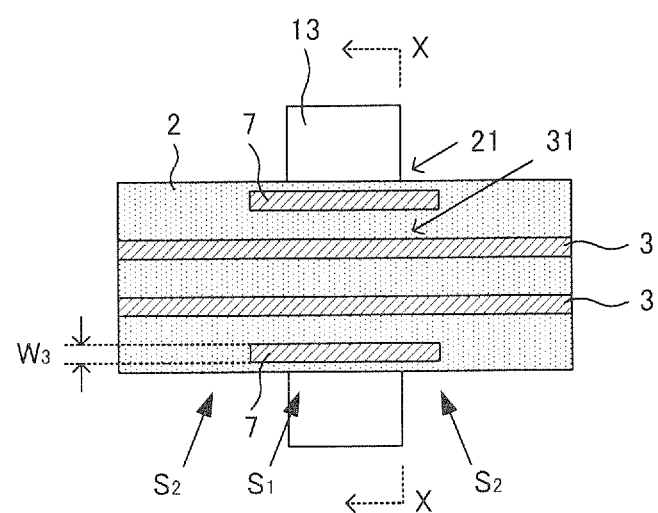
FIGS. 13A and 13B are each a schematic diagram for explaining a substrate for suspension according to a third embodiment.
Figure 13B:
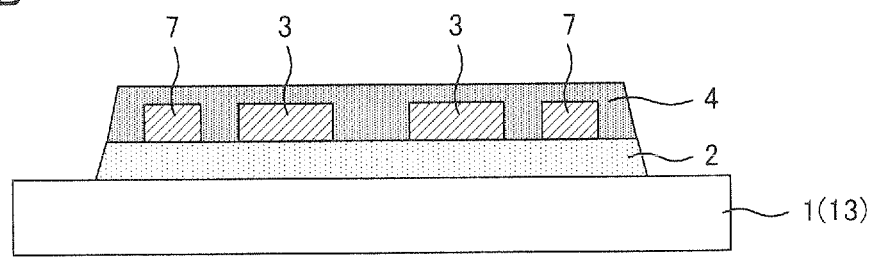

FIGS. 13A and 13B are each a schematic diagram showing an example of the substrate for suspension of the third embodiment. FIG. 13A is a schematic plan view showing the vicinity of the crossbar like FIG. 7A and FIG. 13B is a sectional view along the line X-X of FIG. 13A. The substrate for suspension of the third embodiment is characterized by the feature that the auxiliary wiring layer 7 is formed between the edge 31 of the wiring layer 3 and the edge 21 of the insulating layer 2 in planar view at the boundary region.

As mentioned above, according to the third embodiment, the auxiliary wiring layer is formed between the edge of the wiring layer and the edge of the insulating layer in planar view at the boundary region and therefore, the influence of cracks generated in the insulating layer can be reduced. Therefore, the wiring layer can be, for example, prevented from being burned out by stress concentration. Particularly, there is a recent need for the development of a thin insulating layer and therefore, cracks tend to be easily generated in the insulating layer. However, according to the third embodiment, the influence of cracks can be efficiently reduced.

With regard to the substrate for suspension of the third embodiment, the member and structure of the substrate for suspension will be explained separately.

(1) Member of the Substrate for Suspension

First, the member of the substrate for suspension of the third embodiment will be explained. The substrate for suspension of the third embodiment has a metal supporting substrate, an insulating layer, a wiring layer, and a cover layer. These members are the same as those described in the aforementioned "1. First embodiment (1) Member of the substrate for suspension" and the explanations of these members are therefore omitted here.

Also, the substrate for suspension of the third embodiment has an auxiliary wiring layer. Although the auxiliary wiring layer may be constituted of a material which may be either the same as or different from that of the wiring layer, the former is preferable. This is because the auxiliary wiring layer can be formed at the same time as the wiring layer is formed.

(2) Structure of the Substrate for Suspension

Next, the structure of the substrate for suspension of the third embodiment will be explained. The substrate for suspension of the third embodiment is largely characterized by the feature that the auxiliary wiring layer is formed between the edge of the wiring layer and the edge of the insulating layer in planar view at the boundary region.

When, as shown in FIG. 13A, the width of the auxiliary wiring layer is $W_3$, the value of $W_3$ is preferably in a range from 10 μm to 50 μm, more preferably in a range from 15 μm to 30 μm and even more preferably in a range from 15 μm to 20 μm. This is because when the value of $W_3$ is too small, there is the possibility that the progress of cracks can be insufficiently restrained, whereas when the value of $W_3$ is too large, there are many restrictions on design freedom.

In the third embodiment, the position of the edge of the insulating layer preferably coincides with the position of the edge of the cover layer as shown in FIG. 13B. This is because the generation of cracks can be intrinsically restrained. The definition of the above term "coincide" is the same as that described in the above paragraph "2. Second embodiment" and the explanations of the definition are omitted.

No particular limitation is imposed on the position where the auxiliary wiring layer is formed as long as it is positioned between the edge of the wiring layer (outermost wiring layer) and the edge of the insulating layer. Particularly, in the third embodiment, it is preferable that the surface of the auxiliary wiring layer 7 is covered with the cover layer 4 as shown in FIG. 13B. This is because the auxiliary wiring layer 7 can be prevented from being deteriorated (for example, corroded).

Figure 14A:
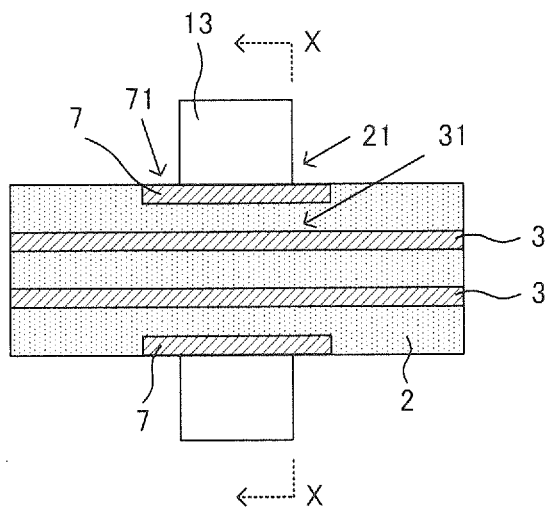
FIGS. 14A and 14B are each a schematic diagram for explaining the substrate for suspension according to the third embodiment.

Also, as shown in FIG. 14A, the edge 71 of the auxiliary wiring layer 7 may coincide with the edge 21 of the insulating layer 2. If they coincide with each other, the generation of cracks can be intrinsically restrained. The above term "coincide" means that the edge of the position of the upper surface of the insulating layer coincides with the position of the edge of the lower surface of the auxiliary wiring layer. Also, the term "coincide" means not only strict coincidence but also substantial coincidence. The term "substantial coincidence" means that the width from the edge of the lower surface of the auxiliary wiring layer to the edge of the upper surface of the insulating layer is 10 μm or less (preferably 5 μm or less). In this case, the edge of the lower surface of the auxiliary wiring layer may be positioned either inside or outside the edge of the upper surface of the insulating layer.

Also, in the case where the insulating layer is formed by wet etching and the edge of the insulating layer is made to coincide with the edge of the auxiliary wiring layer at the boundary region, the angle θ of the lower end section of the insulating layer can be increased, and the generation of cracks can be restrained. Generally, the insulating layer and the auxiliary wiring layer are strongly bonded with each other. This prevents an etching solution from infiltrating between both layers and therefore, the angle θ of the insulating layer can be increased. The generation of cracks can be restrained by increasing the angle. The angle θ of the lower end section of the insulating layer formed below the auxiliary wiring layer is for example, preferably 30 degrees or more, more preferably 40 degrees or more and even more preferably 50 degrees or more.

Figure 14B:
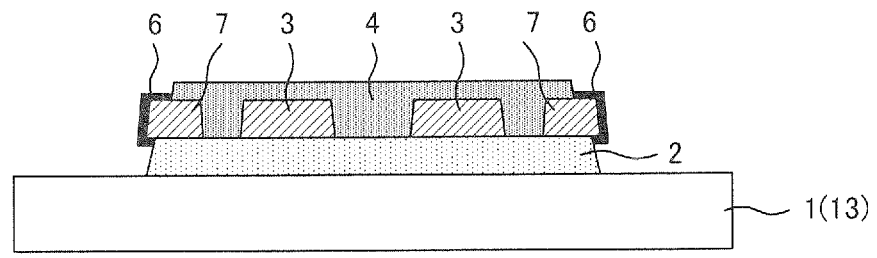

When the edge 71 of the auxiliary wiring layer 7 coincides with the edge 21 of the insulating layer 2 as shown in FIG. 14A, a wiring plating section 6 is preferably formed on the surface of the auxiliary wiring layer 7 as shown in FIG. 14B. This is because the auxiliary wiring layer can be prevented from being deteriorated (for example, corroded). In this case, if the auxiliary wiring layer is formed of material having high corrosion resistance, it is unnecessary to particularly form the wiring plating section. As examples of a method of forming the wiring plating section, a method may be, though not shown, given in which a via portion which penetrates through the insulating layer to connect the auxiliary wiring layer electrically with the metal supporting substrate and electricity is supplied to the auxiliary wiring layer from the metal support substrate and via portion to form a wiring plating section by the electrolytic plating method. Also, the wiring plating section may be formed by the electroless plating method.

Figure 15:
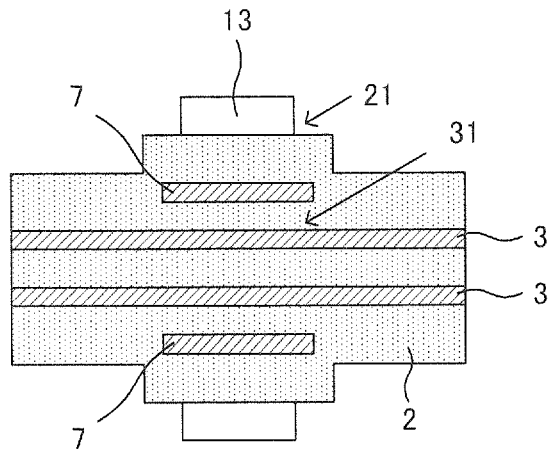
FIG. 15 is a schematic plan view for explaining the substrate for suspension according to the third embodiment.

Also, the substrate for suspension of the third embodiment may have the characteristics of the substrate for suspension of the second embodiment. Specifically, an auxiliary wiring layer is formed between the edge of the wiring layer and the edge of the insulating layer in planar view at the boundary region, and further, at least one of the width from the edge of the wiring layer to the edge of the insulating layer and the width from the edge of the wiring layer to the edge of the cover layer may be locally larger. As an example, as shown in FIG. 15, a substrate for suspension may be given in which an auxiliary wiring layer 7 is formed between the edge 31 of the wiring layer 3 and the edge 21 of the insulating layer 2 and further, the width from the edge 31 of the wiring layer 3 to the edge 21 of the insulating layer 2 is locally large in planar view. Other things are also basically the same as those described in the first or second embodiment.

B. Production Process of Substrate for Suspension

Next, a production process of substrate for suspension according to the present invention will be explained. The production process of substrate for suspension according to the present invention may be largely classified into three embodiments.

1. First Embodiment

In this first embodiment, there is provided a production process of substrate for suspension comprises: a metal supporting substrate, an insulating layer formed on the metal supporting substrate, a wiring layer formed on the insulating layer, and a cover layer formed to cover the wiring layer, a first structural part including the metal supporting substrate, the insulating layer, the wiring layer, and the cover layer, and a second structural part formed so as to extend continuously from the first structural part and has no metal supporting substrate, the method comprises a step of: forming the insulating layer by carrying out wet etching such that a position of an edge of an upper surface of the insulating layer coincides with a position of an edge of a lower surface of the cover layer or the position of the edge of the upper surface of the insulating layer is positioned on a side closer to the wiring layer than to the position of the edge of the lower surface of the cover layer at a boundary region between the first structural part and the second structural part.

Figure 16A:
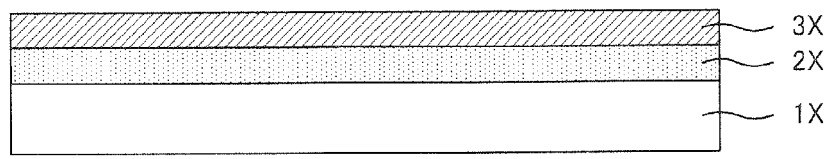
FIGS. 16A to 16E are a schematic sectional view showing an example of a production process of substrate for suspension according to the first embodiment.
Figure 16B:
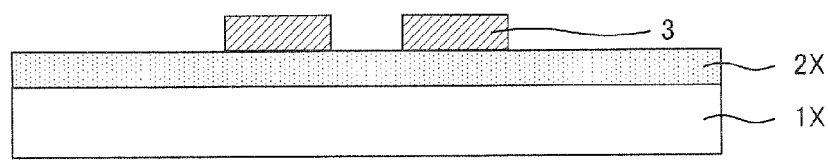

FIGS. 16A to 16E are a schematic sectional view showing an example of the production process of substrate for suspension according to the first embodiment. Similar to FIGS. 4A to 4C, FIGS. 16A to 16E correspond to the sectional view along the line X-X of FIG. 3. In FIGS. 16A to 16E, first, a laminate member is prepared and the laminated member has a metal supporting member 1X, an insulating member 2X formed on the metal supporting member 1X and a conductive member 3X formed on the insulating member 2X (FIG. 16A). Next, a prescribed resist pattern (patterned resist layer) is formed on the surface of the conductive member 3X by using a dry film resist (DFR) and the conductive member 3X exposed from the resist pattern is wet-etched to form a wiring layer 3 (FIG. 16B). At this time, the same resist pattern may be formed on the surface of the metal supporting member 1X and a jig hole and the like may be formed at the same time when the above wet etching is carried out.

Figure 16C:
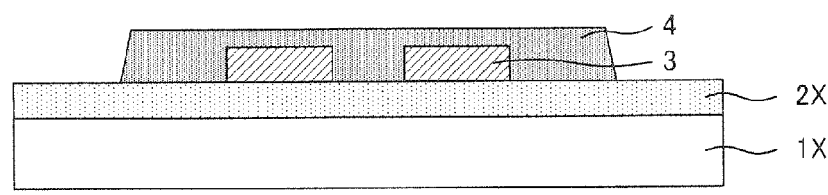
Figure 16D:
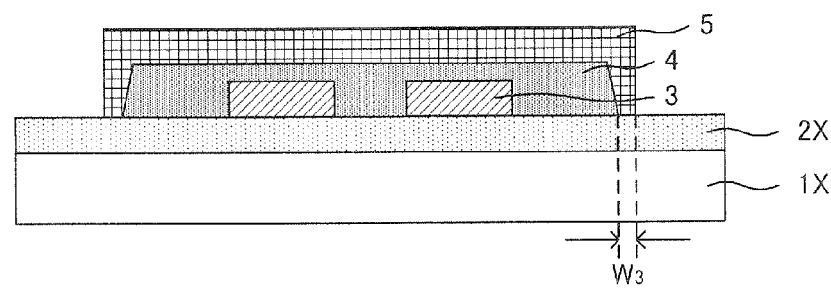
Figure 16E:
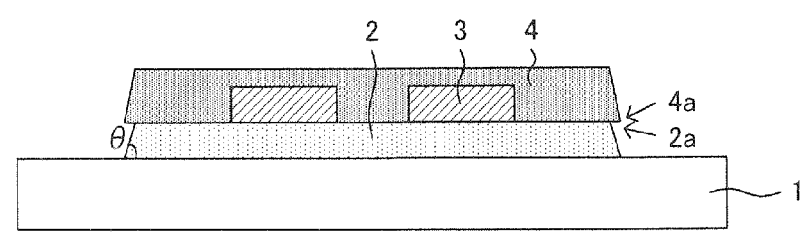

After that, a cover layer 4 is formed in to cover the wiring layer 3 (FIG. 16C). Then, a resist pattern 5 is formed so as to cover the cover layer 4 by using DFR (FIG. 16D). At this time, the width $W_3$ from the edge of the lower surface of the cover layer 4 to the edge of the lower surface of the resist pattern 5 is preferably, for example, 10 μm or less and more preferably in a range from 4 μm to 6 μm. When the value of $W_3$ is too large, there is a tendency that an area where an etching solution infiltrates into the boundary between the insulating layer 2 and the resist pattern 5 is widened and the angle θ of the lower end section of the insulating layer 2 is decreased. Then, the insulating member 2X exposed from the resist pattern 5 is wet-etched to form an insulating layer 2 (FIG. 16E). The production process of substrate for suspension in the first embodiment is characterized by the feature that the edge 2a of the upper surface of the insulating layer 2 coincides with the edge 4a of the lower surface of the cover layer 4 or is positioned on the side closer to the wiring layer 3 than to the edge 4a of the lower surface of the cover layer 4. In FIG. 16E, the processing of the outline of the metal supporting member 1X is carried out by wet etching to form a metal supporting substrate 1.

Figure 17A:
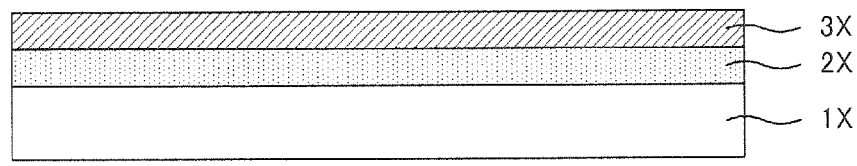
FIGS. 17A to 17D are a schematic sectional view showing another example of the production process of substrate for suspension according to the first embodiment.
Figure 17B:
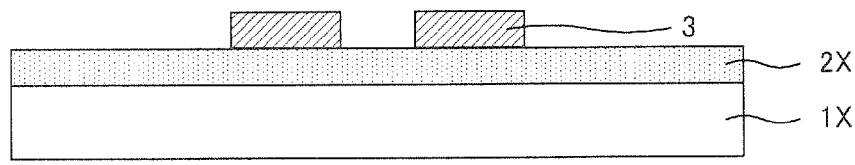
Figure 17C:
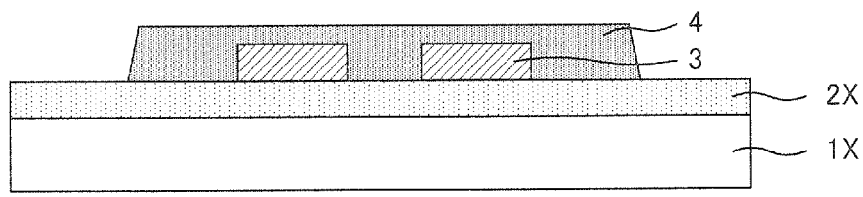
Figure 17D:
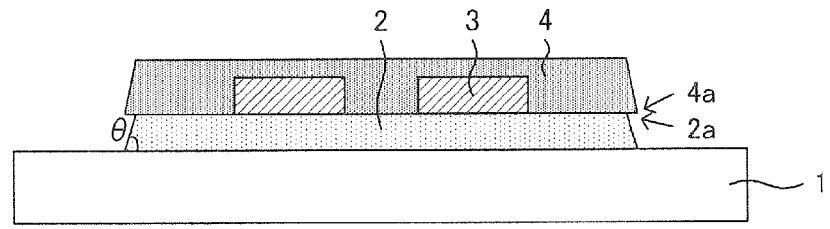

FIGS. 17A and 17D are each a schematic sectional view showing another example of the production process of substrate for suspension according to the first embodiment. Although the production process illustrated in FIGS. 17A to 17D is basically the same as the production process illustrated in FIGS. 16A to 16E. In FIG. 17C, the resist pattern is not formed using DFR or the like and the insulating member 2X is wet-etched by using the cover layer 4 as the resist layer.

As mentioned above, according to the first embodiment, the insulating layer is formed by carrying out wet etching in such a manner that the position of the edge of the upper surface of the insulating layer coincides with the position of the edge of the lower surface of the cover layer or is positioned on the side closer to the wiring layer than to the edge of the lower surface of the cover layer. This ensures that the substrate for suspension which restrains the generation of cracks in the insulating layer can be obtained. Also, the insulating layer and cover layer in the first embodiment are highly adhesive to each other from the viewpoint of securing the durability required for a product. It is therefore possible to prevent an etching solution from infiltrating into a space between both layers and the angle θ of the lower end section of the insulating layer can be increased, and the generation of cracks can be restrained from this also.

Figure 18A:
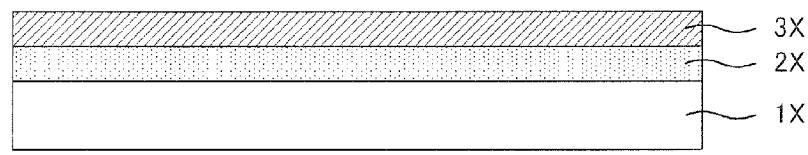
FIGS. 18A to 18E are a schematic sectional view for explaining the effect of the first embodiment.
Figure 18B:
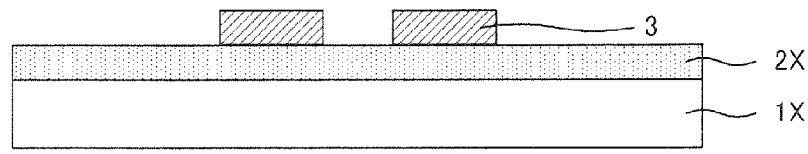
Figure 18C:
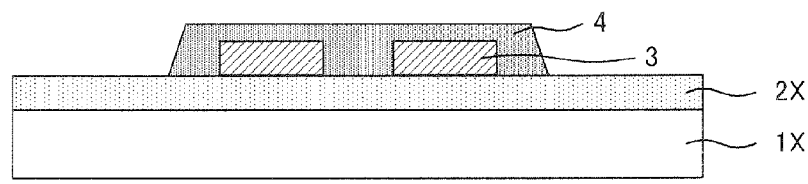
Figure 18D:
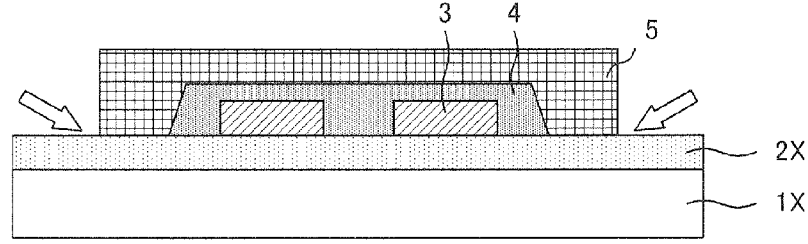
Figure 18E:
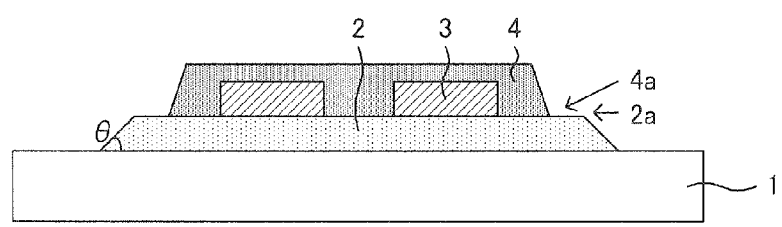

If edge 2a of the upper surface of the insulating layer 2 is positioned on a considerably outer side of the edge 4a of the lower surface of the cover layer 4 as shown in FIGS. 18A to 18E (FIG. 18E), the edge of the insulating layer 2 is not reinforced and therefore cracks are easily generated. Moreover, the insulating layer 2 is less bonded with the resist pattern 5 in usual as shown in FIG. 18D. Therefore, an etching solution infiltrates in a space between both layers, so that the angle θ of the lower end section of the insulating layer 2 becomes small, and cracks are easily generated due to this point. When a solvent type photoresist or alkali developing peelable type photoresist is used for the resist layer in the formation of the insulating layer, particularly an alkali type etching solution which is usually used as an etching solution for a polyimide resin may dissolve the resist layer, causing deterioration in the adhesion between the insulating layer and the resist layer. Then, the etching solution infiltrates into a space between the insulating layer and the resist layer to etch the insulating layer at a part into which the etching solution infiltrates, and as the result, the insulating layer has a conspicuous taper shape.

Also, no particular limitation is imposed on the production process of substrate for suspension in the first embodiment insofar as the method involves the insulating layer formation step. As an example of the production process of substrate for suspension in the first embodiment, each step shown in FIGS. 16 and 17 will be explained.

(1) Laminate Member Preparation Step

The laminate member preparation step in the first embodiment is a step of preparing a laminate member provided with a metal supporting member, an insulating member formed on the metal supporting member and a conductive member formed on the insulating member. As the laminate member in the first embodiment, a commercially available laminate member may be used or the laminate member may also be formed by forming an insulating member and a conductive member on a metal supporting member.

(2) Wiring Layer Formation Step

The wiring layer formation step in the first embodiment is a step of forming a wiring layer by forming a resist pattern on the conductive member of the laminate member and by wet-etching the conductive member exposed from the resist pattern. The type of etching solution used in the wet etching is preferably selected corresponding to the type of conductive member. When the material of the conductive member is, for example, copper, an iron chloride type etching solution or the like may be used. Also, when other layers are etched by the above etching solution, it is preferable to form a resist protecting these other layers from the etching solution according to the need.

(3) Cover Layer Formation Step

The cover layer formation step in the first embodiment is a step of forming a cover layer covering the wiring layer. No particular limitation is imposed on the method of forming a cover layer and it is preferable to select an appropriate method corresponding to the type of cover layer. When the material of the cover layer is a photosensitive material, the cover layer formed on the entire surface is exposed to light to obtain a patterned cover layer. When the material of the cover layer is a non-photosensitive material, a prescribed resist pattern is formed on the surface of the cover layer formed on the entire surface and the part exposed from the resist pattern is removed by wet etching to thereby obtain a patterned cover layer.

(4) Insulating Layer Formation Step

The insulating layer formation step in the first embodiment is a step of forming an insulating layer by carrying out wet etching in such a manner that the position of the edge of the upper surface of the insulating layer coincides with the position of the edge of the lower surface of the cover layer or is positioned on the side closer to the wiring layer than to the edge of the lower surface of the cover layer at the boundary region between the first structural part and the second structural part.

It is preferable that the type of etching solution to be used in the wet etching is properly selected corresponding to the type of insulating layer. When the material of the insulating layer is, for example, a polyimide resin, an alkali type etching solution or the like may be used.

In the first embodiment, the cover layer is preferably used as a resist layer in the insulating layer formation step. This is because it is unnecessary to form a resist layer separately. Moreover, the adhesion between the insulating layer and the cover layer is made to be high in usual from the viewpoint of securing the durability required for a product. Therefore, the infiltration of an etching solution between both layers can be prevented, and the angle θ of the lower end section of the insulating layer can be increased. When the cover layer is used as the resist layer, the material of the cover layer is preferably a material having a lower etching rate for the etching solution than the material of the wiring layer. This is because such a material is useful for the resist layer. Even in the case where the etching rate of the material of the cover layer is the same as or higher than that of the material of the wiring layer, the cover layer can be used as the resist layer if the thickness of the cover layer can be secured sufficiently, for example.

Also, it is unnecessary to use the cover layer as the resist layer. In this case, it is necessary to form a resist layer separately to cover the cover layer. However, this has the advantage that the material can be selected in a wide range of materials because it is unnecessary to take the etching rate of the material of the cover layer into consideration.

(5) Metal Supporting Substrate Formation Step

The metal supporting substrate formation step in the first embodiment is a step of forming a metal supporting substrate by wet-etching the metal supporting member. Generally, in this step, outline processing of the metal supporting member is carried out. The type of etching solution used in the wet etching is preferably selected according to the type of metal supporting member. When the material of the metal supporting member is SUS, an iron chloride type etching solution or the like may be used. Also, when other layers are etched by the above etching solution, it is preferable to form a resist protecting these other layers from the etching solution according to the need.

(6) Other Steps

The production process of substrate for suspension according to the first embodiment may involve, besides the above steps, a wiring plating section formation step of forming a wiring plating section at a part of the wiring layer. The method of forming a wiring plating section is preferably the electrolytic plating method though it may be the electrolytic plating method or electroless plating method. The production process of substrate for suspension according to the first embodiment may involve a via section formation step of forming a via portion which penetrates through the insulating layer and connects the wiring layer electrically with the metal supporting substrate. Examples of a method of forming the via portion may include the plating methods (electrolytic plating method and electroless plating method).

2. Second Embodiment

Next, a second embodiment of the production process of substrate for suspension according to the present invention will be explained. In this second embodiment, there is provided a production process of substrate for suspension comprising: a metal supporting substrate, an insulating layer formed on the metal supporting substrate, a wiring layer formed on the insulating layer, and a cover layer formed to cover the wiring layer, a first structural part including the metal supporting substrate, the insulating layer, the wiring layer, and the cover layer, and a second structural part formed so as to extend continuously from the first structural part and has no metal supporting substrate, the method comprises a step of: forming at least one of the insulating layer and the cover layer such that at least one of a width from an edge of the wiring layer to an edge of the insulating layer and a width from the edge of the wiring layer to an edge of the cover layer is locally large in planar view at a boundary region between the first structural part and the second structural part.

Figure 19A:
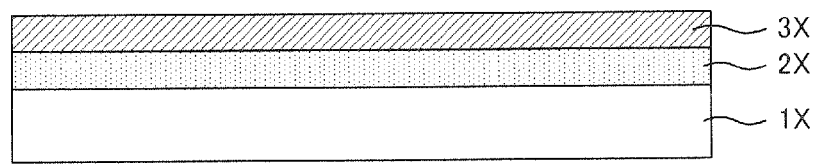
FIGS. 19A to 19E are a schematic sectional view showing an example of a production process of substrate for suspension according to the third embodiment.
Figure 19B:
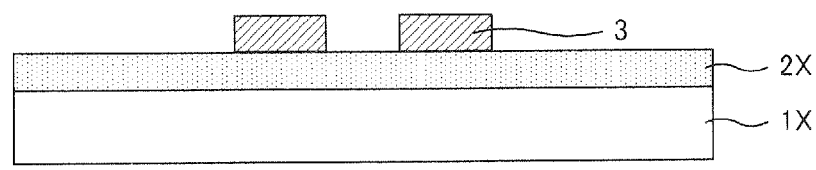

FIGS. 19A to 19E are a schematic sectional view showing an example of the production process of substrate for suspension according to the second embodiment. Similar to FIG. 8A, FIGS. 19A to 19E correspond to the sectional view along the line X-X of FIG. 7A. In FIGS. 19A to 19E, first, a laminate member is prepared which has a metal supporting member 1X, an insulating member 2X formed on the metal supporting member 1X, and a conductive member 3X formed on the insulating member 2X (FIG. 19A). Next, a prescribed resist pattern (patterned resist layer) is formed on the surface of the conductive member 3X by using a dry film resist (DFR) and the conductive member 3X exposed from the resist pattern is wet-etched to form a wiring layer 3 (FIG. 19B). At this time, the same resist pattern may be formed on the surface of the metal supporting member 1X and a jig hole and the like may be formed at the same time when the above wet etching is carried out.

Figure 19C:
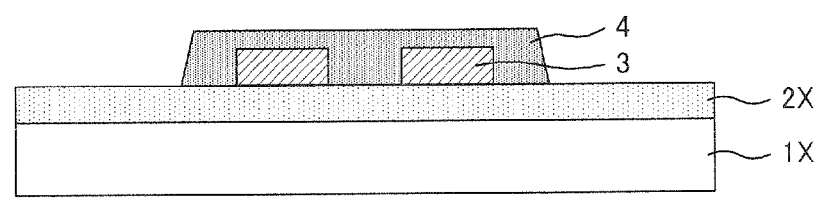
Figure 19D:
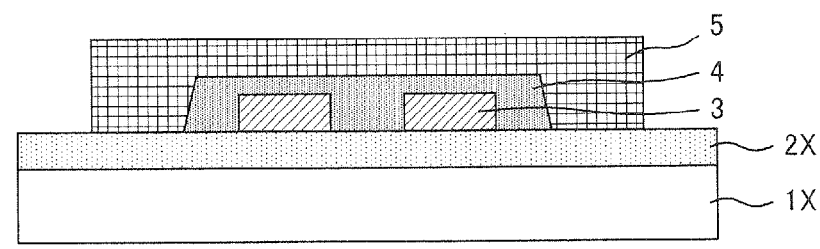
Figure 19E:
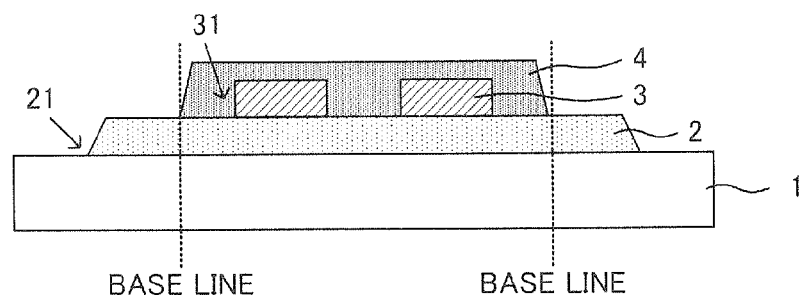

After that, a cover layer 4 is formed to cover the wiring layer 3 (FIG. 19C). Then, a resist pattern 5 is formed so as to cover the cover layer 4 by using DFR (FIG. 19D). Then, the insulating member 2X exposed from the resist pattern 5 is wet-etched to form an insulating layer 2 (FIG. 19S). The production process of substrate for suspension in the second embodiment is characterized by the feature that the insulating layer 2 is formed such that the width from the edge 31 of the wiring layer 3 to the edge 21 of the insulating layer 2 is made be locally large in this wet etching. In FIG. 19E, the processing of the outline of the metal supporting member 1X is carried out by wet etching to form a metal supporting substrate 1.

Figure 20A:
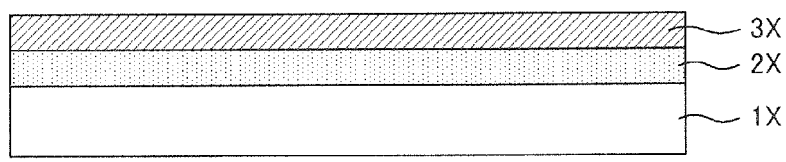
FIGS. 20A to 20D are a schematic sectional view showing another example of a production process of substrate for suspension according to the second embodiment.
Figure 20B:
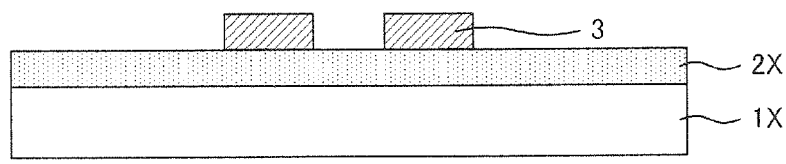
Figure 20C:
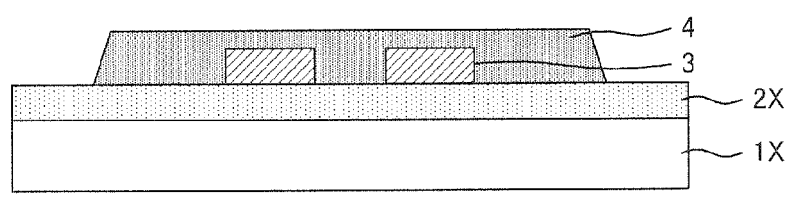
Figure 20D:
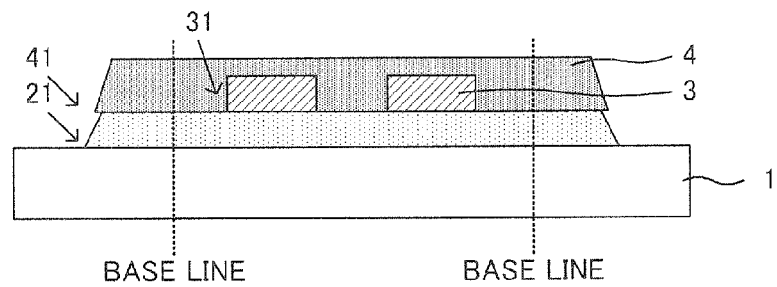

FIGS. 20A to 20D are a schematic sectional view showing another example of the production process of substrate for suspension according to the second embodiment. Similar to FIG. 8B, FIGS. 20A to 20D correspond to the sectional view along the line X-X of FIG. 7B. Although the production process illustrated in FIGS. 20A to 201D is basically the same as that illustrated in FIGS. 19A to 19E, the resist pattern is not formed by DFR or the like and the insulating member 2X is wet etched using the cover layer 4 as the resist layer in FIG. 20C. This enables easy production of the substrate for suspension in which the edge 21 of the insulating layer 2 coincides with the edge 41 of the cover layer 4.

As an example of the production process of substrate for suspension as shown in FIG. 8C, the additive method may be given. In the additive method, first, a patterned insulating layer 2 is formed on the surface of a metal supporting substrate 1. Then, a resist pattern is formed on the insulating layer 2 and a wiring layer 3 is formed on the insulating layer exposed from the resist pattern by the plating method. Then, the cover layer 4 may be formed such that the width from the edge 31 of the wiring layer 3 to the edge 41 of the cover layer 4 is locally large.

According to the second embodiment as mentioned above, the substrate for suspension with reduced influence of cracks generated in the insulating layer can be obtained by forming at least one of the insulating layer and the cover layer such that at least one of the width from the edge of the wiring layer to the edge of the insulating layer and the width from the edge of the wiring layer to the edge of the cover layer is locally large in planar view at the boundary region.

No particular limitation is imposed on the production process of substrate for suspension according to the second embodiment insofar as the method involves a step of forming at least one of the insulating layer and the cover layer in the above specified configuration. Each step illustrated in the above FIGS. 19 and 20 will be explained as an example of the production process of substrate for suspension in the second embodiment.

(1) Laminate Member Preparation Step

The laminate member preparation step in the second embodiment is the same as that described in the above paragraph "B. Production process of substrate for suspension 1. First embodiment", and therefore, the explanation of the step is omitted here.

(2) Wiring Layer Formation Step

The wiring layer formation step in the second embodiment is the same as that described in the above paragraph "B. Production process of substrate for suspension 1. First embodiment", and therefore, the explanation of the step is omitted here.

(3) Cover Layer Formation Step

The cover layer formation step in the second embodiment is the same as that described in the above paragraph "B. Production process of substrate for suspension 1. First embodiment", and therefore, the explanation of the step is omitted here.

(4) Insulating Layer Formation Step

The insulating layer formation step in the second embodiment is a step of forming an insulating layer by wet-etching the above insulating member.

It is preferable that the type of etching solution used for the wet etching is properly selected according to the type of insulating layer. When the material of the insulating layer is, for example, a polyimide resin, an alkali type etching solution or the like may be used.

In the second embodiment, the cover layer is preferably used as the resist layer in the insulating layer formation step. This reason is the same as that described in the above paragraph "B. Production process of substrate for suspension 1. First embodiment", and therefore, the explanation of this reason is omitted here.

In the second embodiment, it is unnecessary to use the cover layer as the resist layer. In this case, it is necessary to form a resist layer separately to cover the cover layer. However, this has the advantage that the material can be selected in a wide range of materials because it is unnecessary to take the etching rate of the material of the cover layer into consideration.

Also, when a solvent type photoresist or alkali developing peelable type photoresist is used for the resist layer in the formation of the insulating layer, particularly an alkali type etching solution which is usually used as an etching solution for a polyimide resin may dissolve the resist layer, causing deterioration in the adhesion between the insulating layer and the resist layer. Due to that, the etching solution infiltrates between the insulating layer and the resist layer to etch the insulating layer at a part into which the etching solution infiltrates, and as the result, the insulating layer exhibits a conspicuous taper shape.

In the second embodiment, particularly, it is preferable to form the insulating layer and the cover layer such that the position of the edge of the insulating layer coincides with the position of the edge of the cover layer at the above boundary region. This is because the generation of cracks can be intrinsically restrained.

(5) Metal Supporting Substrate Formation Step

The metal supporting substrate formation step in the second embodiment is the same as that described in the above paragraph "B. Production process of substrate for suspension 1. First embodiment", and therefore, the explanation of the step is omitted here.

(6) Other Steps

The production process of substrate for suspension according to the second embodiment may involve, besides the above steps, a wiring plating section formation step of forming a wiring plating section at a part of the wiring layer. The production process of substrate for suspension according to the second embodiment may involve a via section formation step of forming a via portion which penetrates through the insulating layer and connects the wiring layer electrically with the metal supporting substrate. These steps are the same as those described in the above paragraph "B. Production process of substrate for suspension 1. First embodiment", and therefore, the explanation of these steps are omitted here.

3. Third Embodiment

Next, a third embodiment of the production process of substrate for suspension according to the present invention will be explained. The production process of substrate for suspension in the third embodiment is a production process of substrate for suspension comprises: a metal supporting substrate, an insulating layer formed on the metal supporting substrate, a wiring layer formed on the insulating layer, and a cover layer formed to cover the wiring layer, a first structural part including the metal supporting substrate, the insulating layer, the wiring layer, and the cover layer, and a second structural part formed so as to extend continuously from the first structural part and has no metal supporting substrate, the method comprises a step of: a wiring layer formation step of forming an auxiliary wiring layer between an edge of the wiring layer and an edge of the insulating layer in planar view at a boundary region between the first structural part and the second structural part.

FIGS. 21A to 21D are a schematic sectional view showing an example of the production process of substrate for suspension in the third embodiment. Similar to FIG. 13B, FIGS. 21A to 21D correspond to the sectional view along the line X-X of FIG. 13A. Though the production process illustrated in FIGS. 21A to 21D are basically the same as the production process illustrated in FIGS. 19A to 19E, an auxiliary wiring layer 7 is formed at the same time when the wiring layer 3 is formed in FIG. 21B. Although the cover layer 4 is used as the resist layer in FIG. 21C, a resist pattern may be separately formed by using DFR or the like. The auxiliary wiring layer 7 may be used as the resist layer in the case of obtaining a substrate for suspension as shown in FIG. 14A.

According to the above third embodiment, as mentioned above, an auxiliary wiring layer is formed between the edge of the wiring layer and the edge of the insulating layer at the boundary region and therefore, a substrate for suspension with reduced influence of cracks generated in the insulating layer can be obtained.

No particular limitation is imposed on the production process of substrate for suspension in the third embodiment insofar as the method involves a wiring layer formation step of forming an auxiliary wiring layer. Although the auxiliary wiring layer and other wiring layers may be formed either simultaneously or in separate steps, the former is preferable. This is because the production process can be simplified. Also, each step in the production process of substrate for suspension in the third embodiment is the same as that in the above paragraph "B. Production process of substrate for suspension 2. Second embodiment", and therefore, the explanation of the step is omitted here The present invention is not limited to the aforementioned embodiments. These embodiments are examples and whatever has substantially the same structure and produces the same action effect as the technical spirit described in the claim of the present invention is embraced by the technical scope of the present invention.

EXAMPLES

The present invention will be explained in more detail by way of examples.

Example 1

A laminate member comprising 18-μm-thick SUS 304 (metal supporting member), a 10-μm-thick polyimide resin layer (insulating member) and a 9-μm-thick electrolytic copper layer (conductive member) was prepared (FIG. 16A). Then, resist patterns were simultaneously formed on both surfaces of the laminate member by patterning using a dry film resist in such a manner as to form a jig hole for which positional accuracy was important on the SUS side and a wiring layer on the electrolytic copper side. Then, etching was carried out using a ferric chloride solution, followed by peeling of the resist (FIG. 16B).

Next, the surface of the patterned wiring layer was coated with a polyimide precursor solution by a die coater and the coating film was dried. Then, a resist pattern was formed, and developed while the polyimide precursor film was etched at the same time. Then, the resulting film was heated under a nitrogen atmosphere to cure (imidization) to form a cover layer (FIG. 16C). The cover layer was formed in such a way as to cover the wiring layer. The thickness of the cover layer formed on the wiring layer was 5 μm.

Then a resist pattern was formed to form an insulating member by patterning and the exposed part of the polyimide resin was removed by wet etching (FIG. 16D). At this time, $W_3$ in FIG. 16D was 5 μm. The edge of the upper surface of the insulating layer was made to coincide with the edge of the lower surface of the cover layer by this wet etching. Finally, a resist pattern was formed to carry out the processing of the outline of the metal supporting member and the exposed part of SUS was removed by wet etching to obtain a substrate for suspension (FIG. 16E). The angle θ of the lower end section of the insulating layer was 50 degrees.

Example 2

A substrate for suspension was obtained in the same manner as in Example 1 except that a polyimide resin having a lower etching rate than the polyimide resin which was the insulating member was used as the material of the cover layer and the cover layer was used as the resist (see FIGS. 17A to 17D). The angle θ of the lower end section of the insulating layer was 60 degrees.

Example 3

A laminate member comprising 18-μm-thick SUS 304 (metal supporting member), a 10-μm-thick polyimide resin layer (insulating member) and a 9-μm-thick electrolytic copper layer (conductive member) was prepared (FIG. 19A). Then, resist patterns were simultaneously formed on both surfaces of the laminate member by patterning using a dry film resist in such a manner as to form a jig hole for which positional accuracy was important on the SUS side and a wiring layer on the electrolytic copper side. Then, etching was carried out using a ferric chloride solution, followed by peeling of the resist (FIG. 19B).

Next, the surface of the patterned wiring layer was coated with a polyimide precursor solution by a die coater and the coating film was dried. Then, a resist pattern was formed, and developed while the polyimide precursor film was etched at the same time. Then, the resulting film was heated under a nitrogen atmosphere to cure (imidization) to form a cover layer (FIG. 19C). The cover layer was formed in such a way as to cover the wiring layer. The thickness of the cover layer formed on the wiring layer was 5 μm.

Then, a resist pattern was formed to form an insulating member by patterning and the exposed part of the polyimide resin was removed by wet etching (FIG. 19D). Finally, a resist pattern was formed to carry out the processing the outline of the metal supporting member and the exposed part of SUS was removed by wet etching to obtain a substrate for suspension (FIG. 19E). The width $W_1$ (see FIG. 9A) from the base line of the insulating layer 2 to the edge 21 of the insulating layer 2 was 80 μm.

Example 4

A substrate for suspension was obtained in the same manner as in Example 3 except that a polyimide resin having a lower etching rate than the polyimide resin which was the insulating member was used as the material of the cover layer and the cover layer was used as the resist (see FIGS. 20A to 20D).

Example 5

Figure 21A:
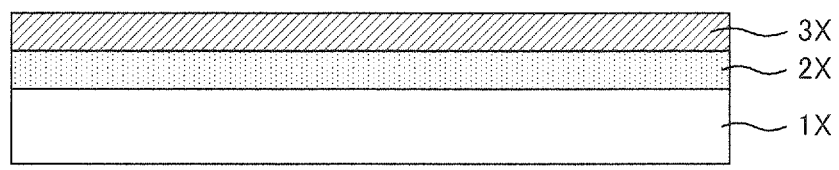
FIGS. 21A to 21D are a schematic sectional view showing an example of the production process of substrate for suspension according to the third embodiment.
Figure 21B:
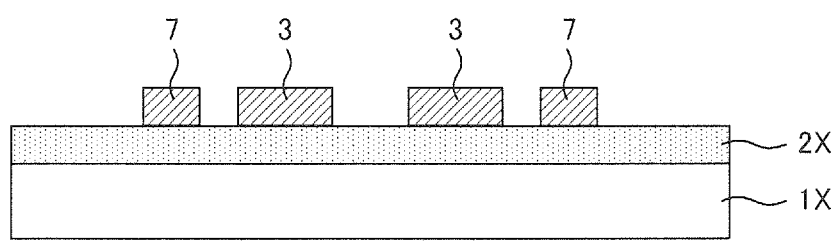

A laminate member comprising 18-μm-thick SUS 304 (metal supporting member), a 10-μm-thick polyimide resin layer (insulating member) and a 9-μm-thick electrolytic copper layer (conductive member) was prepared (FIG. 21A). Then, resist patterns were simultaneously formed on both surfaces of the laminate member by patterning using a dry film resist in such a manner as to form a jig hole for which positional accuracy was important on the SUS side and a wiring layer and an auxiliary wiring layer on the electrolytic copper side. Then, etching was carried out using a ferric chloride solution, followed by peeling of the resist (FIG. 21B). The width $W_3$ of the auxiliary wiring layer 7 (see FIG. 13A) was 20 μm.

Figure 21C:
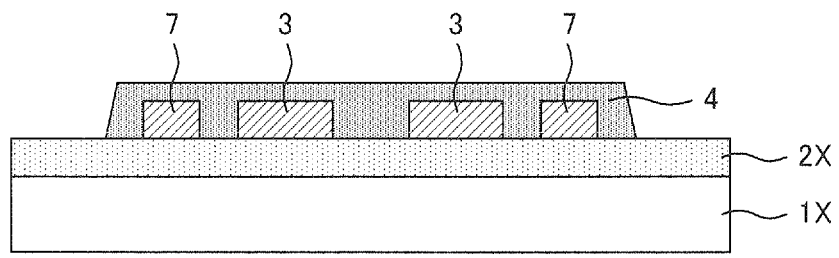

Next, the surface of the patterned wiring layer was coated with a polyimide precursor solution by a die coater and the coating film was dried. Then, a resist pattern was formed, and developed while the polyimide precursor film was etched. Then, the resulting film was heated under a nitrogen atmosphere to cure (imidization) to form a cover layer (FIG. 21C). The cover layer was formed in such a way as to cover the wiring layer. The thickness of the cover layer formed on the wiring layer was 10 μm. As the material of the cover layer, a polyimide resin was used which had a lower etching rate than the polyimide resin which was the insulating member.

Figure 21D:
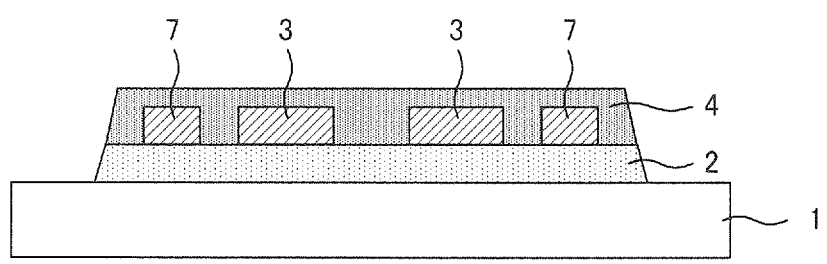

Then, the exposed part of the polyimide resin was removed by wet etching using the cover layer as the resist layer. Finally, a resist pattern was formed to carry out the processing of the outline of the metal supporting member and the exposed part of SUS was removed by wet etching to obtain a substrate for suspension (FIG. 21D).

REFERENCE SIGNS LIST

1: Metal supporting substrate, 2: Insulating layer, 2a: Upper end of insulating layer, 3: Wiring layer, 4: Cover layer, 4a: Lower end of Cover layer, 5: Resist layer (resist pattern), 6: Wiring plating section, 7: Auxiliary wiring layer, 11: Tongue section, 12: Outrigger section, 13: Crossbar, 14: Trace support tab, 15: Base section, 16: Oscillation center, 51: Crack

The invention claimed is:

1. A substrate for suspension comprising a metal supporting substrate, an insulating layer formed on the metal supporting substrate, a wiring layer formed on the insulating layer, and a cover layer formed to cover the wiring layer,
wherein the substrate for suspension comprises
a first structural part including the metal supporting substrate, the insulating layer, the wiring layer, and the cover layer, and a second structural part in which at least the insulating layer is continuously formed from the first structural part, in a planer view from a laminate direction of the metal supporting substrate, the insulating layer, the wiring layer and the cover layer, and the second structural part has no metal supporting substrate, and
wherein the first structural part and the second structural part are adjacent in a longitudinal direction of the wiring layer in a planer view from the laminate direction, and
at least one of a width from an edge of the wiring layer to an edge of the insulating layer and a width from the edge of the wiring layer to an edge of the cover layer is larger in an area including a boundary between the first structural part and the second structural part than other areas in a planar view from the laminate direction.

2. The substrate for suspension according to claim 1, wherein a position of the edge of the insulating layer coincides with a position of the edge of the cover layer in the area including the boundary between the first structural part and the second structural part.

3. The substrate for suspension according to claim 1, wherein a curved structural section is formed so as to include the boundary between the first structural part and the second structural part in planar view from the laminate direction, on at least one of the insulating layer and the cover layer.

4. A substrate for suspension comprising a metal supporting substrate, an insulating layer formed on the metal supporting substrate, a wiring layer formed on the insulating layer, and a cover layer formed to cover the wiring layer,
wherein the substrate for suspension comprises
a first structural part including the metal supporting substrate, the insulating layer, the wiring layer, and the cover layer, and
a second structural part in which at least the insulating layer is continuously formed from the first structural part in a planer view from a laminate direction of the metal supporting substrate, the insulating layer, the wiring layer and the cover layer, and the second structural part has no metal supporting substrate, and
wherein the first structural part and the second structural part are adjacent in a longitudinal direction of the wiring layer in a planer view from the laminate direction, and
an auxiliary wiring layer not connected to an outside is formed between an edge of the wiring layer and an edge of the insulating layer so as to cross the boundary between the first structural part and the second structural part in planar view from the laminate direction.

5. The substrate for suspension according to claim 4, wherein a surface of the auxiliary wiring layer is covered with the cover layer.

6. The substrate for suspension according to claim 4, wherein a wiring plating section is formed on a surface of the auxiliary wiring layer.

7. The substrate for suspension according to claim 4, wherein at least one of a width from the edge of the wiring layer to the edge of the insulating layer and a width from the edge of the wiring layer to an edge of the cover layer is larger in an area including a boundary between the first structural part and the second structural part than other areas in planer view from the laminated layer direction.

8. The substrate for suspension according to claim 1, wherein the metal supporting substrate has a tongue section for mounting a device and an outrigger section positioned outside the tongue section; and the wiring layer is formed between the tongue section and the outrigger section in planar view.

9. The substrate for suspension according to claim 4, wherein the metal supporting substrate has a tongue section for mounting a device and an outrigger section positioned outside the tongue section; and the wiring layer is formed between the tongue section and the outrigger section in planar view.

10. The substrate for suspension according to claim 8, wherein the metal supporting substrate has a crossbar connecting the tongue section with the outrigger section; and the metal supporting substrate of the first structural part is the crossbar.

11. The substrate for suspension according to claim 9, wherein the metal supporting substrate has a crossbar connecting the tongue section with the outrigger section; and the metal supporting substrate of the first structural part is the crossbar.

12. The substrate for suspension according to claim 8, wherein the metal supporting substrate has a trace support tab on an end surface of the tongue section side of the outrigger section; and the metal supporting substrate of the first structural part is the trace support tab.

13. The substrate for suspension according to claim 9, wherein the metal supporting substrate has a trace support tab on an end surface of the tongue section side of the outrigger section; and the metal supporting substrate of the first structural part is the trace support tab.

14. The substrate for suspension according to claim 8, wherein the metal supporting substrate has a base part supporting a bottom of the outrigger section; and the metal supporting substrate of the first structural part is the base part.

15. The substrate for suspension according to claim 9, wherein the metal supporting substrate has a base part supporting a bottom of the outrigger section; and the metal supporting substrate of the first structural part is the base part.

16. The substrate for suspension according to claim 8, wherein the metal supporting substrate of the first structural part is the tongue section.

17. The substrate for suspension according to claim 9, wherein the metal supporting substrate of the first structural part is the tongue section.

* * * * *